(12) United States Patent
Adamovich et al.

(10) Patent No.: US 9,054,343 B2
(45) Date of Patent: Jun. 9, 2015

(54) FINE TUNING OF EMISSION SPECTRA BY COMBINATION OF MULTIPLE EMITTER SPECTRA

(71) Applicant: Universal Display Corporation, Ewing, NJ (US)

(72) Inventors: Vadim Adamovich, Yardley, PA (US); Hitoshi Yamamoto, Pennington, NJ (US); Michael S. Weaver, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/151,307

(22) Filed: Jan. 9, 2014

(65) Prior Publication Data
US 2014/0127847 A1    May 8, 2014

Related U.S. Application Data

(62) Division of application No. 13/163,207, filed on Jun. 17, 2011, now Pat. No. 8,659,036.

(51) Int. Cl.
*H01L 51/56* (2006.01)
*H01L 51/50* (2006.01)
*H01L 51/00* (2006.01)

(52) U.S. Cl.
CPC .............. *H01L 51/56* (2013.01); *H01L 51/504* (2013.01); *H01L 51/0059* (2013.01);
(Continued)

(58) Field of Classification Search
CPC ....... H01L 51/56; H01L 51/88; H01L 51/009; H01L 51/0091
USPC .......................................................... 438/46
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Sotoyama et al., "Material and Device Structure Design of Blue Phosphorescent OLEDs for High Efficiency and Enhanced Stability" SID 10 Digest, 2010, pp. 556-559.

(Continued)

*Primary Examiner* — Tran Tran
(74) *Attorney, Agent, or Firm* — Duane Morris LLP

(57) ABSTRACT

A method of fabricating a first device includes providing a first container that contains, in a desired proportion, a first organic emitting material having a first peak wavelength, a second organic emitting material having a second peak wavelength; providing a substrate having a first electrode disposed thereon; depositing an emissive layer over the first electrode, wherein the first container is a source of material for depositing, and wherein the emissive layer has a homogeneous composition and comprises the first and second organic emitting materials in the desired proportion; depositing a second electrode over the first emissive layer, and wherein the second peak wavelength is between 0 and 40 nm greater than the first peak wavelength.

14 Claims, 19 Drawing Sheets

(52) U.S. Cl.
CPC .......... *H01L 51/006* (2013.01); *H01L 51/0072* (2013.01); *H01L 51/0084* (2013.01); *H01L 51/0085* (2013.01); *H01L 51/0087* (2013.01); *H01L 51/0088* (2013.01); *H01L 51/009* (2013.01); *H01L 51/0091* (2013.01)

(56) References Cited

U.S. PATENT DOCUMENTS

| | | |
|---|---|---|
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,192,659 B2 * | 3/2007 | Ricks et al. ............... 428/690 |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0151042 A1 | 8/2003 | Marks et al. |
| 2003/0152802 A1 | 8/2003 | Tsuboyama et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Pakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 99/53724 | 10/1999 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Chang, Mei-Ying et al., "High-Brightness White Organic Light-Emitting Diodes Featuring a Single Emission Layer." Journal of the Electrochemical Society (2009), 156(1), J1-J5.

Wang, D. et al., "Broad wavelength modulating and design of organic white diode based on lighting by using exciplex emmision from mixed acceptors." Applied Physics Letters (2006), 89(23), 233511/1-233511/3.

Adamovich, V. et al, "High-efficiency single dopant white electrophosphorescent light-emitting diodes." New Journal of Chemistry (2002), 26(9), 1171-1178.

Coya, Carmen et al., "White emission from a single-component single-layer solution processed OLED." Proceedings of SPIE (2009), 7415 (Organic Light Emitting Materials and Devices XIII), 74151P/1-745151P/12.

Jou, Jwo-Huei et al., "Efficient, color-stable fluorescent white organic light-emitting diodes with single emission layer by vapor deposition from solvent premixed deposition source." Applied Physics Letters (2006), 88(19), 193501/1-193501/3.

(56) References Cited

OTHER PUBLICATIONS

Jou, Jwo-Huei et al., "Efficient pure-white organic light-emitting diodes with a solution-processed, binary-host employing single emission layer." Applied Physics Letters (2006), 88(14), 141101/1-141101/3.

Yang, J.P. et al., "White light emission from a single layer organic light emitting diode fabricated by spincoating." Chemical Physics Letters(2000), 325(1,2,3), 251-256.

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90:183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 3, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 115-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater, 19:739-743 (2007).

Huang, Wei-Sheng et al., "Highly Phosphorescent Bis-Cyclometalated Iridium Complexes Containing Benzoimidazole-Based Ligands," Chem. Mater, 16(12):2480-2488 (2004).

Hung, L.S. et al., "Anode Modification in Organic Light-Emitting Diodes by Low-Frequency Plasma Polymerization of CHF3," Appl. Phys. Lett, 78(5):673-675 (2001).

Ikai, Masamichi and Tokito, Shizuo, "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1) 162-164 (2002).

Lamansky, Sergey et al., "Synthesis and Characterization of Phosphorescent Cyclometalated Iridium Complexes," Inorg. Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18 (21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based on Silole Derivatives and Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto,Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91209-215 (1997).

Shirota, Yasuhiko et al., "Starburst Molecules Based on p-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NΛCΛN-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes of Poly(3-Hexylthiophene) Electro-Optical Characteristics Related to Structure," Synthetic Metals, 87:171-177 (1997).

Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).

(56) References Cited

OTHER PUBLICATIONS

Tang, C.W. and VanSlyke, S.A., "Organic Electroluminescent Diodes," Appl. Phys. Lett., 51(12):913-915 (1987).

Tung, Yung-Liang et al., "Organic Light-Emitting Diodes Based on Charge-Neutral Ru II PHosphorescent Emitters," Adv. Mater., 17(8)1059-1064 (2005).

Van Slyke, S. A. et al., "Organic Electroluminescent Devices with Improved Stability," Appl. Phys. Lett., 69(15):2160-2162 (1996).

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

\* cited by examiner

FINE TUNING OF EMISSION SPECTRA BY COMBINATION OF MULTIPLE EMITTER SPECTRA

CROSS-REFERENCE TO RELATED APPLICATIONS

This application is a divisional of U.S. application Ser. No. 13/163,207, filed Jun. 17, 2011, the disclosure of which is hereby expressly incorporated by reference in its entirety.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices having desired emission characteristics, and methods of fabricating such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted $Ir(ppy)_3$, which has the following structure:

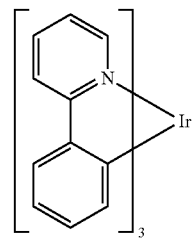

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, and as would be generally understood by one of skill in the art, the term "emitting" as used to describe a material in a device refers to a material that emits a significant amount of light when the device is operated under normal conditions. For example, Ir(ppy)$_3$ is a well known emissive organic material. Ir(ppy)$_3$ may be used as an emitting material in an OLED, generally by including it in the emissive layer with a host, in a device designed such that recombination occurs in or near the layer containing Ir(ppy)$_3$, and such that emission from the Ir(ppy)$_3$ is energetically favored. However, Ir(ppy)$_3$ may also be used in an OLED as a material that is not an "emitting" material. For example, it is known to use Ir(ppy)$_3$ as a hole transport material in a hole transport layer, such that the Ir(ppy)$_3$ functions to transport holes to an emissive layer where a different material emits light. In this context, Ir(ppy)$_3$ is not considered an "emitting" material.

More details on OLEDs, and the definitions described above, can be found in U.S. Pat. No. 7,279,704, which is incorporated herein by reference in its entirety.

SUMMARY OF THE INVENTION

A first device is provided. The first device includes an anode, a cathode and an emissive layer disposed between the anode and the cathode. The emissive layer includes a first organic emitting material having a first peak wavelength and a second organic emitting material having a second peak wavelength. The emissive layer has a homogenous composition. The second peak wavelength is between 0 and 40 nm greater than the first peak wavelength.

In one embodiment, the first and second organic emitting materials are phosphorescent organic light emitting materials.

Preferably, the second peak wavelength is between 12 and 28 nm greater than the first peak wavelength.

In some embodiments, first device of claim 1, the first device emits a third peak wavelength that is between the first peak wavelength and the second peak wavelength. Preferably, the concentration of the first organic emitting material in the emissive layer is C1, the concentration of the second organic emitting material in the emissive layer is C2, the first, second and third peak wavelengths are λ1, λ2, and λ3, respectively, and the third peak wavelength λ3 is within 4% of:

$$((\lambda 1\ C1)+(\lambda 2\ C2))/(C1+C2).$$

In some embodiments, wherein the FWHM of the emissive spectrum of the first device is less than the greater of the FWHM of the emissive spectrum of: (i) a second device that is the same as the first device in all respects except that it includes the first emitting material but not the second emitting material, and (ii) a third device that is the same as the first device in all respects except that it includes the second emitting material but not the first emitting material.

In some embodiments, the measured FWHM of the emissive spectrum of the first device is less than the combined emission of the first and second emitting materials calculated based on the proportions of the first and second emitting materials present in the emissive layer. In some embodiments, the measured FWHM of the emissive spectrum of the first device is at least 10% less than the combined emission of the first and second emitting materials calculated based on the proportions of the first and second emitting materials present in the emissive layer.

In some embodiments, the first device is an organic light emitting device.

In some embodiments, the first device is a panel that includes a plurality of organic light emitting devices controlled by an active matrix.

In some embodiments, the first device is a consumer product.

A method of fabricating a first device is provided. A first container is provided that contains, in a desired proportion: a first organic emitting material having a first peak wavelength, and a second organic emitting material having a second peak wavelength. A substrate is provided having a first electrode disposed thereon. An emissive layer is deposited over the first electrode, wherein the first container is a source of material for depositing, and wherein the emissive layer comprises the first and second organic emitting materials in the desired proportion. A second electrode over the first emissive layer. The second peak wavelength is between 0 and 40 nm greater than the first peak wavelength.

In some embodiments, depositing the emissive layer further comprises depositing an organic host along with the first and second organic emitting materials. The organic host may be included in and deposited from the first container, and/or may be deposited from a second container.

Embodiments and preferences discussed above with respect to devices are also applicable to methods described herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
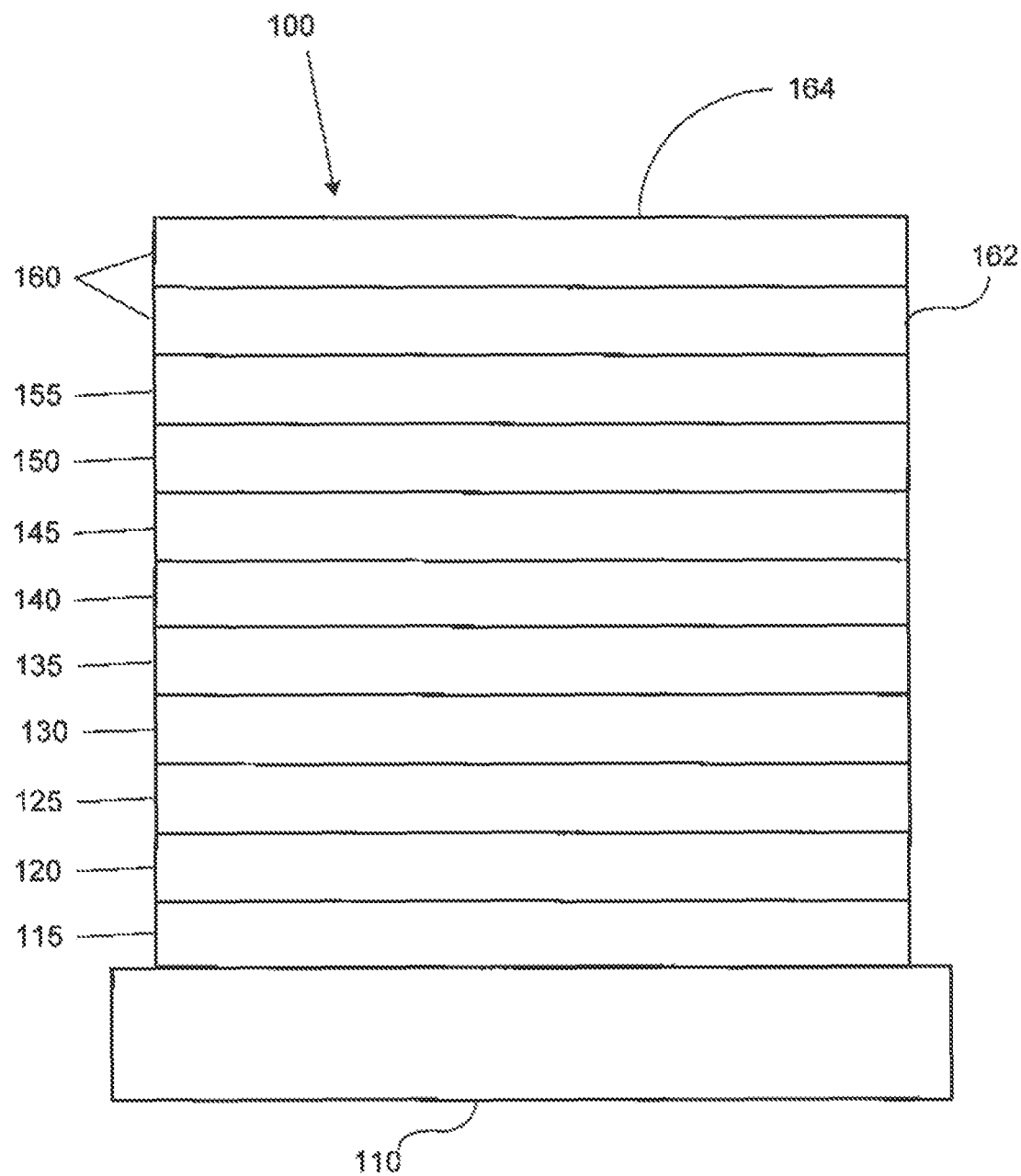
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
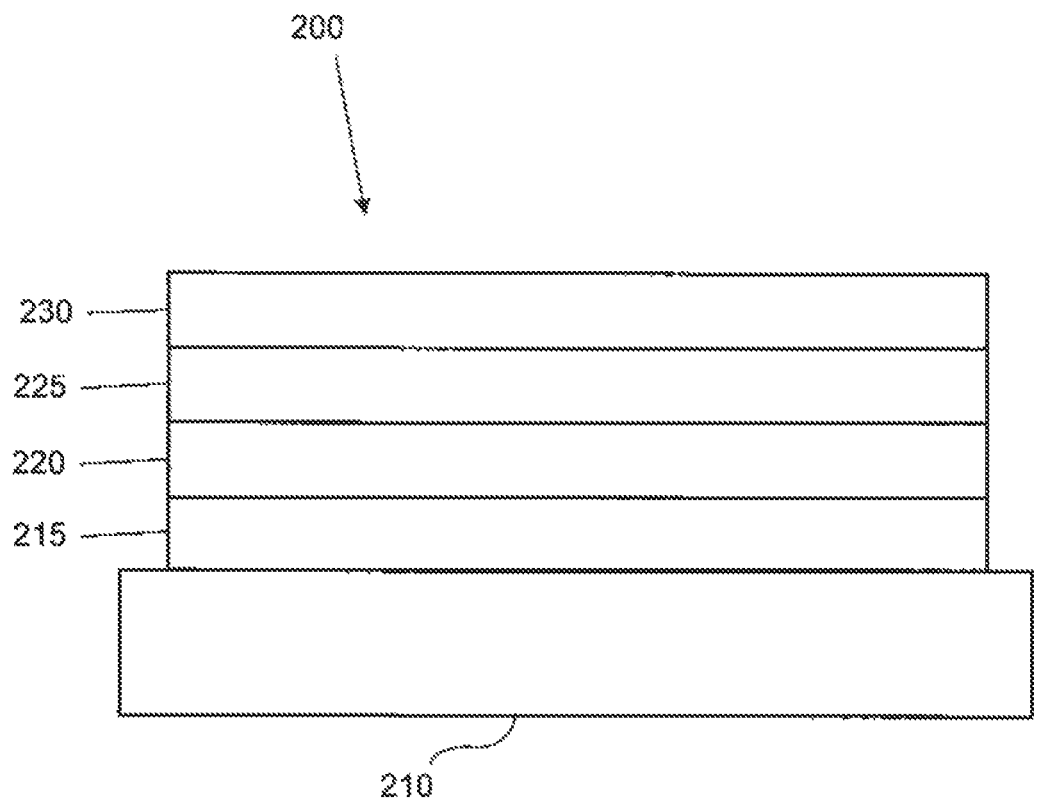
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

A first device is provided. The first device includes an anode, a cathode and an emissive layer disposed between the anode and the cathode. The emissive layer includes a first organic emitting material having a first peak wavelength and a second organic emitting material having a second peak wavelength. The emissive layer has a homogenous composition. The second peak wavelength is between 0 and 40 nm greater than the first peak wavelength.

The first device may include other emissive layers that do not necessarily meet the criteria described in the preceding paragraph. For example, the first device may include a first emissive layer that does meet the criteria of the preceding paragraph, such as inclusion of the first and second organic emitting materials as specified. The first device may further include a second organic emissive layer that does not meet the criteria, and that may, for example, have only a single emitting material, or a non-homogenous composition.

It is known to fabricate an OLED having multiple emitting materials, both in the same layer and in different layers. However, these OLEDs are generally directed to achieving broad spectrum emission. Thus, it is known, for example, to combine green and red emitting materials in a single layer. In this situation, triplets tend to transfer from the higher energy green emitters to the lower energy red emitters, such that proportion of emission from the lower energy red emitters relative to the green emitters may be significantly larger than the proportion of the concentration of red emitter to green emitter. To achieve balanced emission in this situation, those of skill in the art expect that the concentration of red emitter be much lower than the concentration of green emitter. The combined red-green emission may be further combined with blue emission from another layer in the same device, or blue emission from a different device, to achieve broad spectrum emission.

The purpose of embodiments disclosed herein is significant different. Embodiments disclosed herein are directed to using two different emitters in the same layer that emit similar spectra having similar peak wavelengths, with the goal of fine tuning the emission to a specific desired spectra. The desired spectra may be, for example, particular spectra of red, green and blue to which the human eye is particularly sensitive, and which may be required by certain manufacturing standards. By using fine tuning as disclosed herein, it is possible to use to emit a specific desired color two particularly good emitters in terms of lifetime, stability, efficiency, cost, ease of fabrication and the like. While each of the two particularly good emitters may not on their own emit the specific desired color, their emission may be combined as described herein to achieve the specific desired color.

In one embodiment, the first and second organic emitting materials are phosphorescent organic light emitting materials.

Preferably, the second peak wavelength is between 12 and 28 nm greater than the first peak wavelength.

The inventors have found, when combining two emitting materials in the same layer that have somewhat similar peak wavelengths as described here, that the peak wavelength is unexpectedly the concentration-weighted average peak wavelength of the two individual emitting material. This is contrary to conventional wisdom, which predicts that triplets will preferentially transfer to the lower energy material, such that the proportion of emission from the lower energy emitting material compared to the higher energy emitting material is expected to be more than the proportion of its concentration. Thus, in some embodiments, first device of claim 1, the first device emits a third peak wavelength that is between the first peak wavelength and the second peak wavelength. Preferably, the concentration of the first organic emitting material in the emissive layer is C1, the concentration of the second organic emitting material in the emissive layer is C2, the first, second and third peak wavelengths are $\lambda 1$, $\lambda 2$, and $\lambda 3$, respectively, and the third peak wavelength $\lambda 3$ is within 4% of:

$$((\lambda 1\ C1)+(\lambda 2\ C2))/(C1+C2).$$

In some embodiments, wherein the FWHM of the emissive spectrum of the first device is less than the greater of the FWHM of the emissive spectrum of: (i) a second device that is the same as the first device in all respects except that it includes the first emitting material but not the second emitting material, and (ii) a third device that is the same as the first device in all respects except that it includes the second emitting material but not the first emitting material.

"FWHM" or full width half maximum is a term known to the art that refers to the width of a peak at one half of the peak's maximum intensity. In the context of emissive spectra, FWHM is a measure of whether a spectrum is narrow or broad. Generally, narrow peaks have a smaller FWHM than broader peaks. A small FWHM corresponds to a narrow peak, which may also be referred to as more "saturated" than a broader peak. Saturated spectra are desirable in certain contexts, such as for use in displays that do not use color filters. Broad spectrum peaks are useful in other contexts, such as for use in displays that do use color filters, or to emit light for general illumination purposes with a high "CRI" (color rendering index).

The inventors have discovered that, when two emitters are combined in the same emissive layer as described herein, that the width of the total spectra is often less than expected from a calculation based on summing the contributions of the individual emitters. This result is observed in Examples 1, 3, 4 and 5. This result is unexpected. The "width" of a spectrum may be quantified using FWHM. Indeed, the inventors have observed many situations where the width of the total spectrum is even narrower, less than the width of one or preferably both of the spectra of the individual emitting materials that contribute to the total spectrum. This result is also unexpected. While not intending to be limited to any theory of why embodiments of the invention work, the inventors believe that the narrower than expected spectra are the result of the solvachromatic effect, as discussed, for example, in WO99-053724 Color-tunable organic light emitting devices. Forrest, Stephen R.; Bulovic, Vladimir; Thompson, Mark E.; Shoustikov, Andrei.

In some embodiments, the measured FWHM of the emissive spectrum of the first device is less than the combined emission of the first and second emitting materials calculated based on the proportions of the first and second emitting materials present in the emissive layer. In some embodiments, the measured FWHM of the emissive spectrum of the first device is at least 4% less than the combined emission of the first and second emitting materials calculated based on the proportions of the first and second emitting materials present in the emissive layer.

In some embodiments, the first device is an organic light emitting device.

In some embodiments, the first device is a panel that includes a plurality of organic light emitting devices controlled by an active matrix.

In some embodiments, the first device is a consumer product.

A method of fabricating a first device is provided. A first container is provided that contains, in a desired proportion: a first organic emitting material having a first peak wavelength, and a second organic emitting material having a second peak wavelength. A substrate is provided having a first electrode disposed thereon. An emissive layer is deposited over the first electrode, wherein the first container is a source of material for depositing, and wherein the emissive layer comprises the first and second organic emitting materials in the desired proportion. A second electrode over the first emissive layer. The second peak wavelength is between 0 and 40 nm greater than the first peak wavelength.

In some embodiments, depositing the emissive layer further comprises depositing an organic host along with the first and second organic emitting materials. The organic host may be included in and deposited from the first container, and/or may be deposited from a second container.

Embodiments and preferences discussed above with respect to devices are also applicable to methods described herein.

The principle of fine emission tuning of the EL device spectrum is disclosed. As described herein, desirable emission spectrum can be obtained by combination of individual emitters spectra with certain ratio. If 2 emitters with $\lambda 1$ and $\lambda 2$ maximum wavelengths where $\lambda 1<\lambda 2$ are mixed in the device EML in certain ratio, then the maximum wavelength of the resulting device $\lambda 3$ can be fine tuned within range from $\lambda 1$ to $\lambda 2$ by the tuning the relative concentrations of the emitters in the device EML and proportional to the emitters concentration.

The maximum wavelength $\lambda 3$ of EL or PL emission of the device may be tuned to values between $\lambda 1$ to $\lambda 2$ max individual emitter wavelengths by the combination of individual emitters emission in the device, which can be achieved by placing of 2 corresponding emitters into the device EML in a desired concentration ratio. It has been shown that the maximum combined wavelength $\lambda 3$ will be within $\lambda 1$ and $\lambda 2$ range and directly proportional to emitters concentration.

The combination of 2 emitter emission described herein may be useful for fine tuning device emission for a specific wavelength, e.g. to match a specific spectrum requirement for various applications. Such applications include OLED based flat panel displays and lighting.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

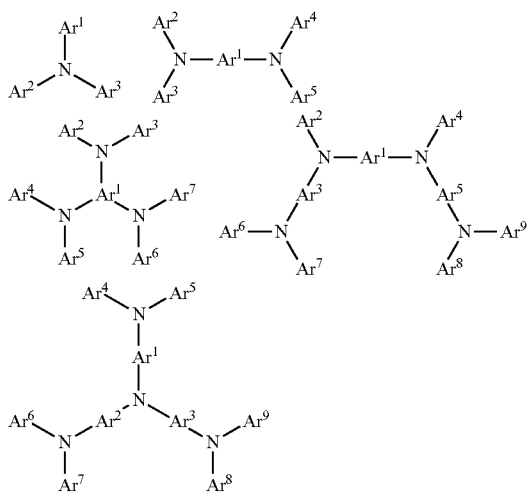

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

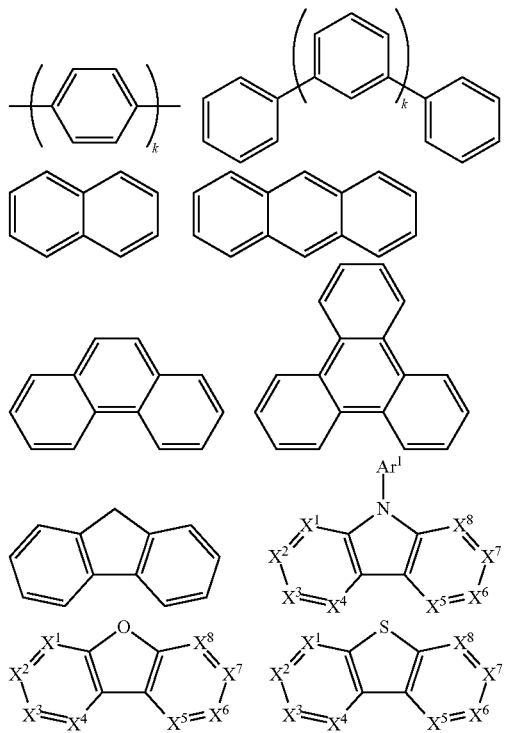

k is an integer from 1 to 20; $X^1$ to $X^8$ is CH or N; $Ar^1$ has the same group defined above.

Examples of metal complexes used in HIL or HTL include, but not limit to the following general formula:

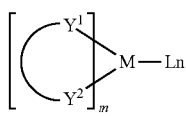

M is a metal, having an atomic weight greater than 40; $(Y^1-Y^2)$ is a bindentate ligand, Y1 and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1-Y^2)$ is a 2-phenylpyridine derivative.

In another aspect, $(Y^1-Y^2)$ is a carbene ligand.

In another aspect, M is selected from Ir, Pt, Os, and Zn.

In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

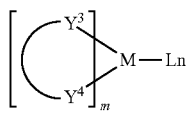

M is a metal; $(Y^3-Y^4)$ is a bindentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

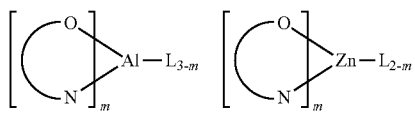

(O—N) is a bidentate ligand, having metal coordinated to atoms O and N.

In another aspect, M is selected from Ir and Pt.

In a further aspect, $(Y^3-Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atome, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

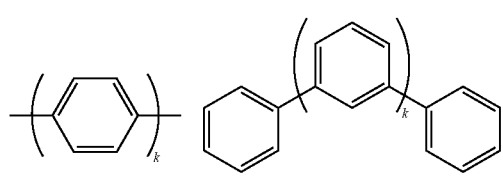

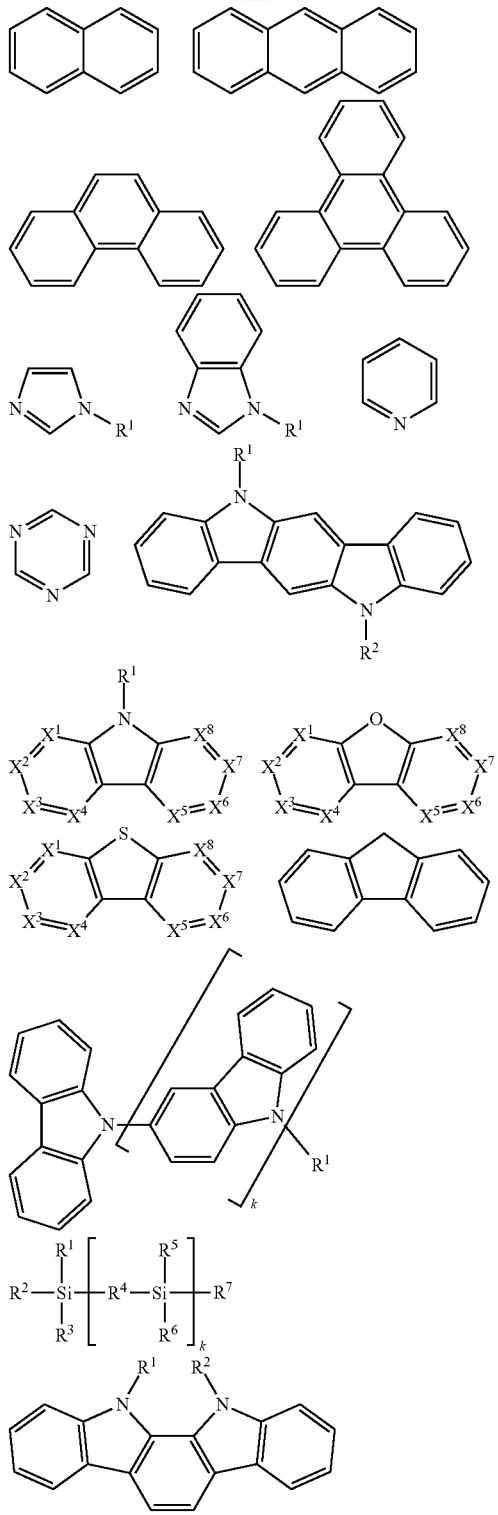

$R^1$ to $R^7$ is independently selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

$X^1$ to $X^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

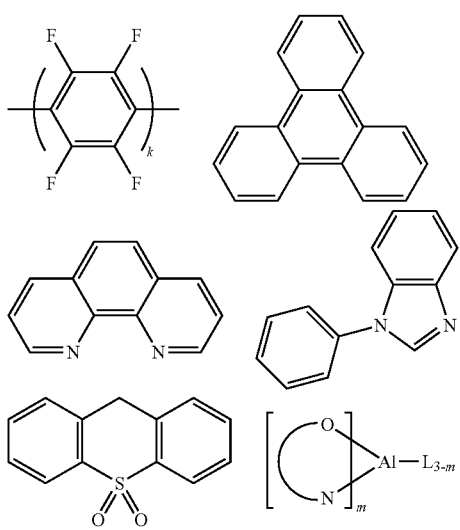

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

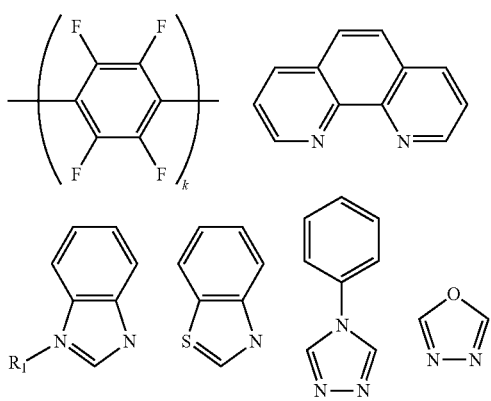

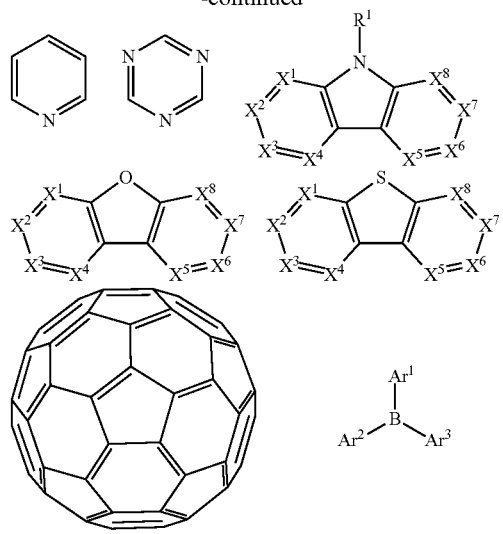

$R^1$ is selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

$Ar^1$ to $Ar^3$ has the similar definition as Ar's mentioned above.

k is an integer from 0 to 20.

$X^1$ to $X^8$ is selected from CH or N.

In another aspect, the metal complexes used in ETL contains, but not limit to the following general formula:

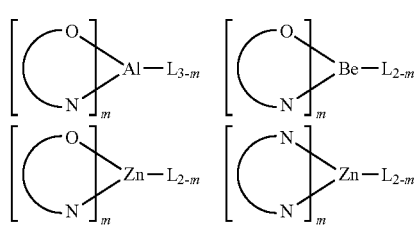

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 1 below. Table 1 lists non-limiting classes of materials, non-limiting examples of compounds for each class, and references that disclose the materials.

TABLE 1
| MATERIAL | EXAMPLES OF MATERIAL | PUBLICATIONS |
| --- | --- | --- |
| Hole injection materials | | |
| Phthalocyanine and porphryin compounds | 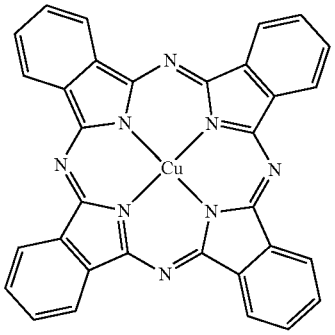 | Appl. Phys. Lett. 69, 2160 (1996) |
| Starburst triarylamines | 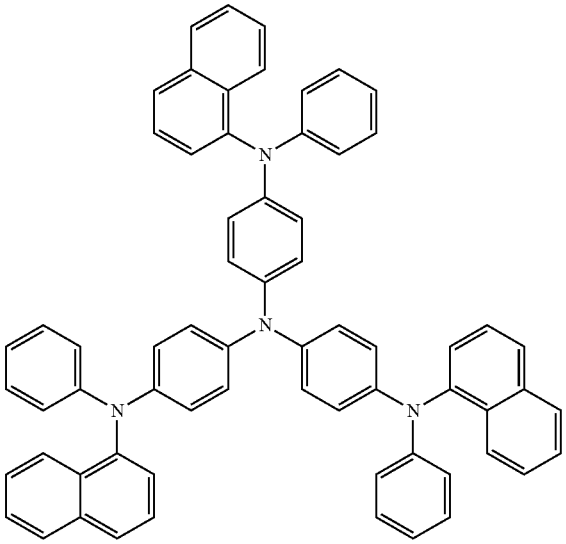 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer | $-\!\!+\!\!CH_xF_y\!\!+\!\!_n-$ | Appl. Phys. Lett. 78, 673 (2001) |
| Conducting polymers (e.g., PEDOT:PSS, polyaniline, polypthiophene) | 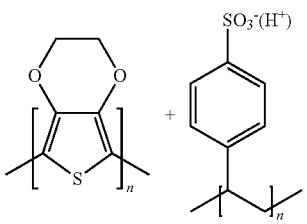 | Synth. Met. 87, 171 (1997) WO2007002683 |
| Phosphonic acid and sliane SAMs | 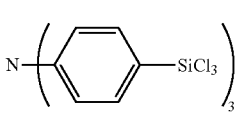 | US20030162053 |

TABLE 1-continued

| MATERIAL | EXAMPLES OF MATERIAL | PUBLICATIONS |
|---|---|---|
| Triarylamine or polythiophene polymers with conductivity dopants | | EP1725079A1 |
| Arylamines complexed with metal oxides such as molybdenum and tungsten oxides | | SID Symposium Digest, 37, 923 (2006) WO2009018009 |

TABLE 1-continued

| MATERIAL | EXAMPLES OF MATERIAL | PUBLICATIONS |
| --- | --- | --- |
| p-type semiconducting organic complexes | | US20020158242 |
| Metal organometallic complexes | | US20060240279 |
| Cross-linkable compounds | | US20080220265 |
| Hole transporting materials | | |
| Triarylamines (e.g., TPD, α-NPD) | | Appl. Phys. Lett. 51, 913 (1987) |
| | | U.S. Pat. No. 5,061,569 |

TABLE 1-continued
| MATERIAL | EXAMPLES OF MATERIAL | PUBLICATIONS |
|---|---|---|
| | 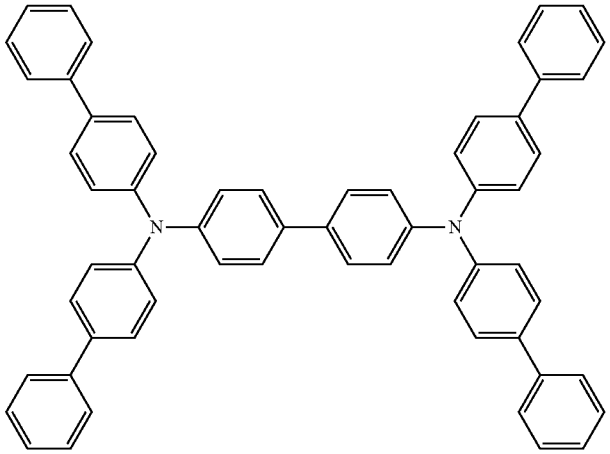 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 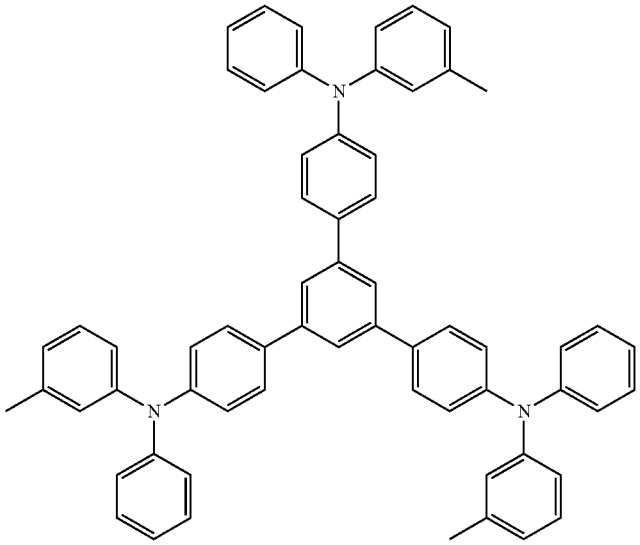 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 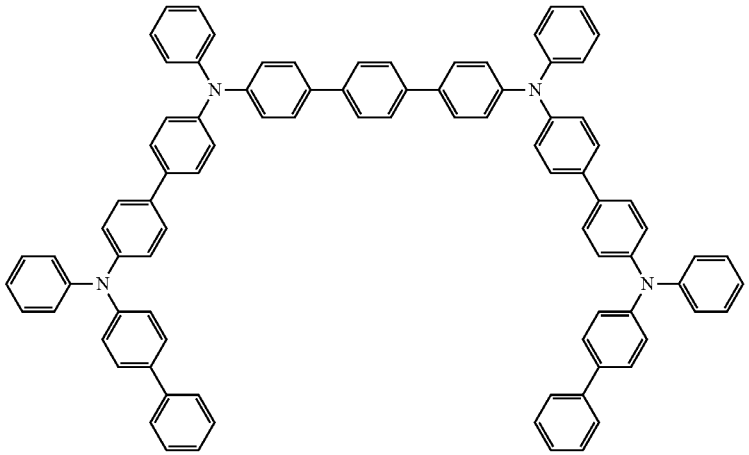 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

| MATERIAL | EXAMPLES OF MATERIAL | PUBLICATIONS |
|---|---|---|
| | 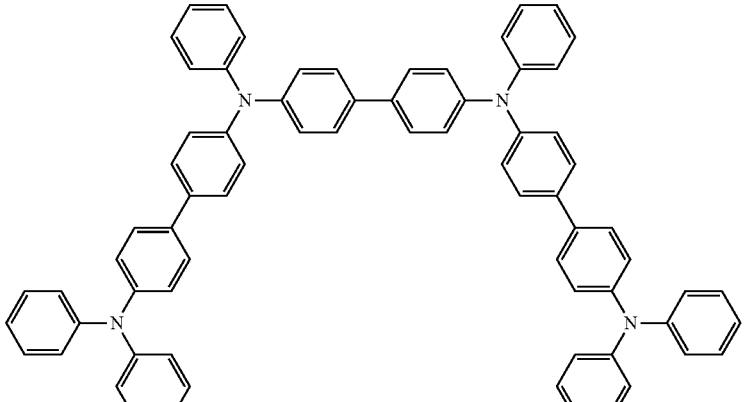 | Appl. Phys. Lett. 90, 183503 (2007) |
| Triaylamine on spirofluorene core | 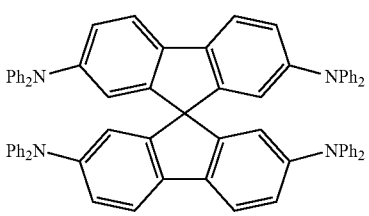 | Synth. Met. 91, 209 (1997) |
| Arylamine carbazole compounds | 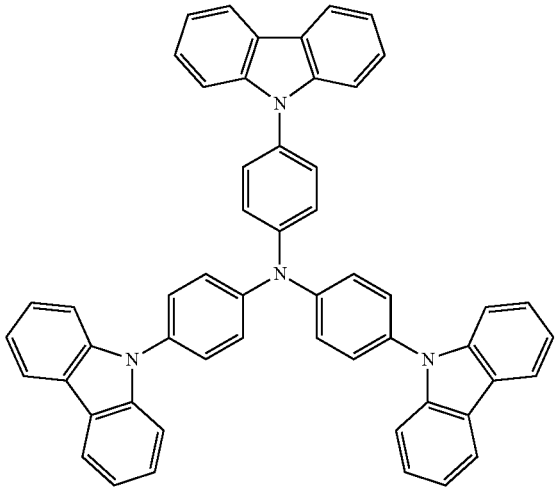 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |
| Triarylamine with (di)benzothiophene/ (di)benzofuran | 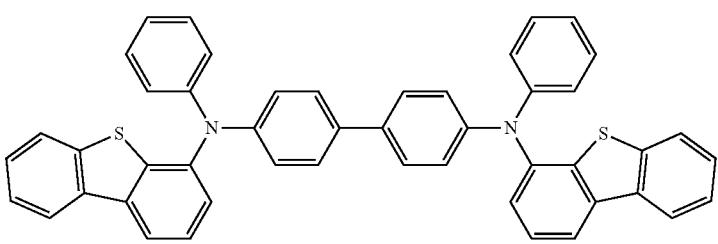 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 |

TABLE 1-continued

| MATERIAL | EXAMPLES OF MATERIAL | PUBLICATIONS |
| --- | --- | --- |
| Indolocarbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials
Red hosts

| | | |
| --- | --- | --- |
| Arylcarbazoles | | Appl. Phys. Lett. 78, 1622 (2001) |

TABLE 1-continued

| MATERIAL | EXAMPLES OF MATERIAL | PUBLICATIONS |
| --- | --- | --- |
| Metal 8-hydroxyquinolates (e.g., Alq₃, BAlq) | | Nature 395, 151 (1998) |
| | | US20060202194 |
| | | WO2005014551 |
| | | WO2006072002 |
| Metal phenoxybenzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE 1-continued

| MATERIAL | EXAMPLES OF MATERIAL | PUBLICATIONS |
|---|---|---|
| Zinc complexes | | WO2009062578 |
| Green hosts | | |
| Arylcarbazoles | | Appl. Phys. Lett. 78, 1622 (2001) |
| | | US20030175553 |
| | | WO2001039234 |
| Aryltriphenylene compounds | | US20060280965 |

TABLE 1-continued
| MATERIAL | EXAMPLES OF MATERIAL | PUBLICATIONS |
|---|---|---|
|  | 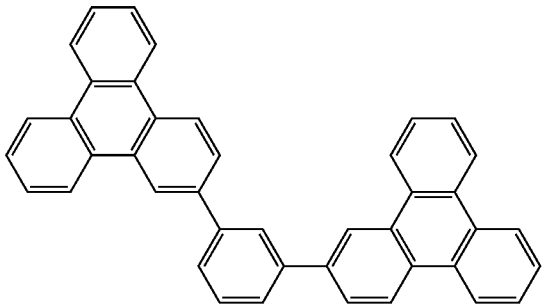 [SMILES: c1cc(-c2ccc3c4ccccc4c4ccccc4c3c2)cc(-c2ccc3c4ccccc4c4ccccc4c3c2)c1] | US20060280965 |
|  | 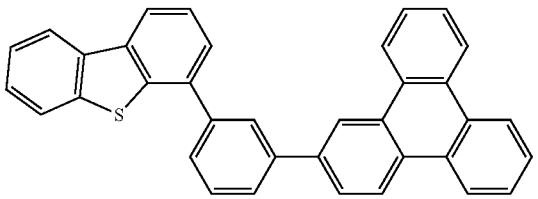 [SMILES: c1cc(-c2ccc3c4ccccc4c4ccccc4c3c2)cc(-c2cccc3c2sc2ccccc23)c1] | WO2009021126 |
| Donor acceptor type molecules | 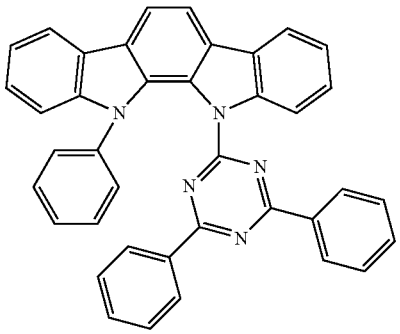 [SMILES: c1ccc(-c2nc(-c3ccccc3)nc(-n3c4ccccc4c4ccc5c6ccccc6n(-c6ccccc6)c5c43)n2)cc1] | WO2008056746 |
| Aza-carbazole/DBT/DBF | 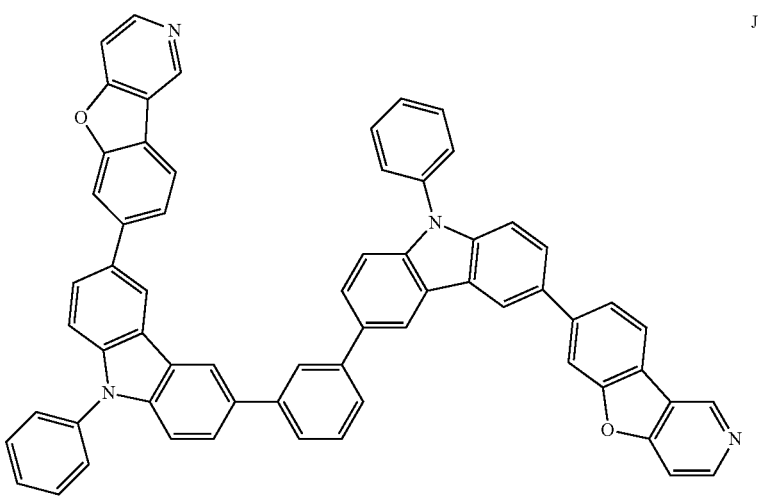 | JP2008074939 |
| Polymers (e.g., PVK) | 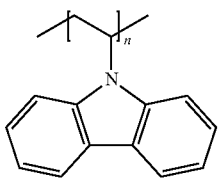 | Appl. Phys. Lett. 77, 2280 (2000) |

TABLE 1-continued

| MATERIAL | EXAMPLES OF MATERIAL | PUBLICATIONS |
| --- | --- | --- |
| Spirofluorene compounds | | WO2004093207 |
| Metal phenoxybenzooxazole compounds | | WO2005089025 |
| | | WO2006132173 |
| | | JP200511610 |
| Spirofluorene-carbazole compounds | | JP2007254297 |

TABLE 1-continued
| MATERIAL | EXAMPLES OF MATERIAL | PUBLICATIONS |
|---|---|---|
| | 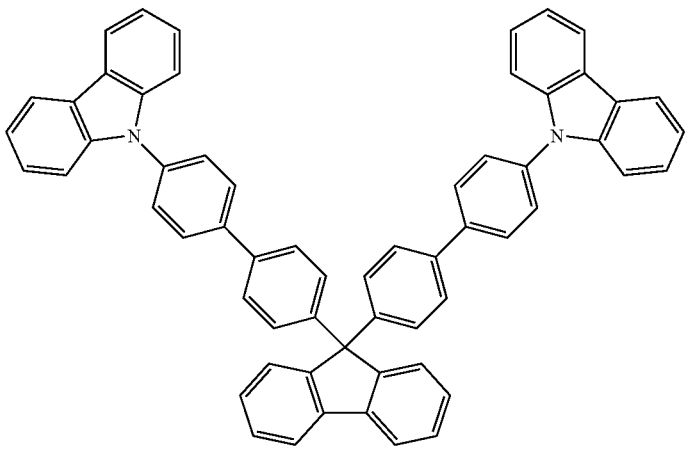 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocabazoles | 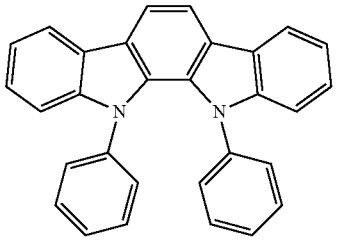 [SMILES: c1ccc(-n2c3ccccc3c3ccc4c5ccccc5n(-c5ccccc5)c4c32)cc1] | WO2007063796 |
| | 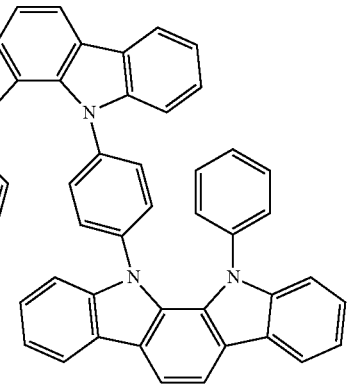 | WO2007063754 |
| 5-member ring electron deficient heterocycles (e.g., triazole, oxadiazole) | 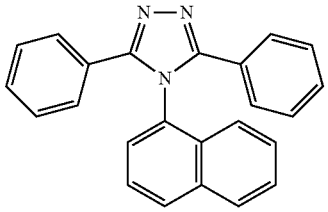 [SMILES: c1ccc(-c2nnc(-c3ccccc3)n2-c2cccc3ccccc23)cc1] | J. Appl. Phys. 90, 5048 (2001) |
| | 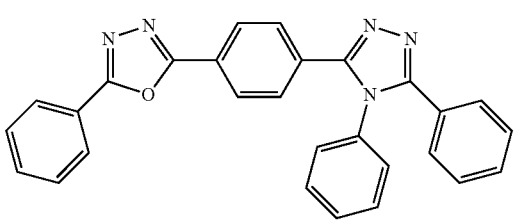 [SMILES: c1ccc(-c2nnc(-c3ccc(-c4nnc(-c5ccccc5)n4-c4ccccc4)cc3)o2)cc1] | WO2004107822 |

TABLE 1-continued

| MATERIAL | EXAMPLES OF MATERIAL | PUBLICATIONS |
| --- | --- | --- |
| Tetraphenylene complexes | | US20050112407 |
| Metal phenoxypyridine compounds | | WO2005030900 |
| Metal coordination complexes (e.g., Zn, Al with N^N ligands) | | US20040137268, US20040137267 |
| Blue hosts | | |
| Arylcarbazoles | | Appl. Phys. Lett, 82, 2422 (2003) |
| | | US20070190359 |

TABLE 1-continued
| MATERIAL | EXAMPLES OF MATERIAL | PUBLICATIONS |
|---|---|---|
| Dibenzothiophene/ Dibenzofuran-carbazole compounds | 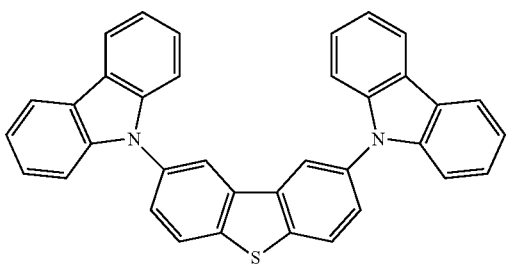 [SMILES: c1ccc2c(c1)c1ccccc1n2-c1ccc2sc3ccc(-n4c5ccccc5c5ccccc54)cc3c2c1] | WO2006114966, US20090167162 |
| | 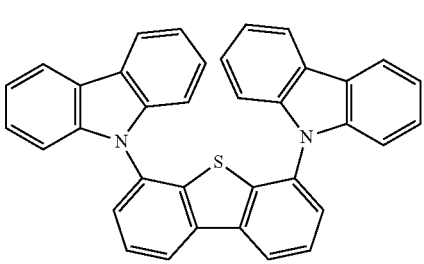 [SMILES: c1cc(-n2c3ccccc3c3ccccc32)c2sc3c(-n4c5ccccc5c5ccccc54)cccc3c2c1] | US20090167162 |
| | 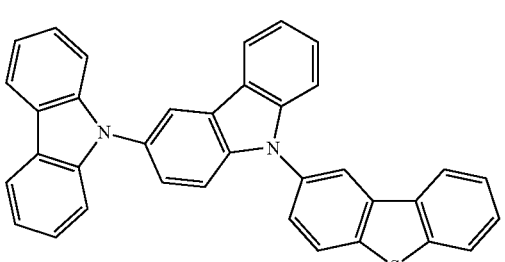 | WO2009086028 |
| | 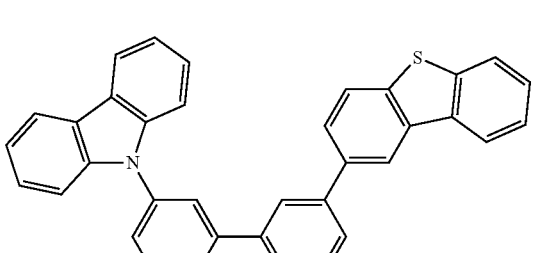 | US20090030202, US20090017330 |
| Silicon aryl compounds | 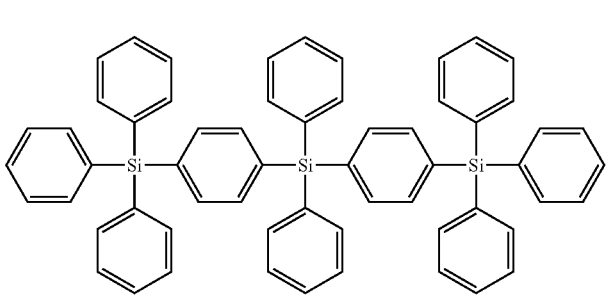 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 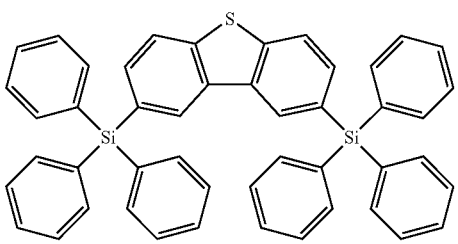 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE 1-continued

| MATERIAL | EXAMPLES OF MATERIAL | PUBLICATIONS |
| --- | --- | --- |
| Silicon/Germanium aryl compounds | | EP2034538A |
| Aryl benzoyl ester | | WO2006100298 |
| High triplet metal organometallic complex | | U.S. Pat. No. 7,154,114 |
| Phosphorescent dopants | | |
| Red dopants | | |
| Heavy metal porphyrins (e.g., PtOEP) | | Nature 395, 151 (1998) |
| Iridium(III) organometallic complexes | | Appl. Phys. Lett. 78, 1622 (2001) |

TABLE 1-continued

| MATERIAL | EXAMPLES OF MATERIAL | PUBLICATIONS |
| --- | --- | --- |
| | | US2006835469 |
| | | US2006835469 |
| | | US20060202194 |
| | | US20060202194 |
| | | US20070087321 |

TABLE 1-continued

| MATERIAL | EXAMPLES OF MATERIAL | PUBLICATIONS |
| --- | --- | --- |
| | | US20070087321 |
| | | Adv. Mater. 19, 739 (2007) |
| | | WO2009100991 |
| | | WO2008101842 |
| Platinum(II) organometallic complexes | | WO2003040257 |

TABLE 1-continued

| MATERIAL | EXAMPLES OF MATERIAL | PUBLICATIONS |
|---|---|---|
| Osminum(III) complexes | [structure with $F_3C$, pyrazole, pyridine, Os(PPhMe$_2$)$_2$]$_2$ | Chem. Mater. 17, 3532 (2005) |
| Ruthenium(II) complexes | [structure with $^tBu$, pyrazole, isoquinoline, Ru(PPhMe$_2$)$_2$]$_2$ | Adv. Mater. 17, 1059 (2005) |
| Rhenium (I), (II), and (III) complexes | [structure with quinolinolate, Re—(CO)$_4$] | US20050244673 |
| Green dopants | | |
| Iridium(III) organometallic complexes | [Ir(ppy)$_3$ structure] and its derivatives | Inorg. Chem. 40, 1704 (2001) |
| | [Ir(ppy)$_2$(acac) structure] | US20020034656 |

TABLE 1-continued

| MATERIAL | EXAMPLES OF MATERIAL | PUBLICATIONS |
| --- | --- | --- |
| | | U.S. Pat. No. 7,332,232 |
| | | US20090108737 |
| | | US20090039776 |
| | | U.S. Pat. No. 6,921,915 |

TABLE 1-continued

| MATERIAL | EXAMPLES OF MATERIAL | PUBLICATIONS |
| --- | --- | --- |
| | | U.S. Pat. No. 6,687,266 |
| | | Chem. Mater. 16, 2480 (2004) |
| | | US20070190359 |
| | | US 20060008670<br>JP2007123392 |
| | | Adv. Mater. 16, 2003 (2004) |

TABLE 1-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| Monomer for polymeric metal organometallic compounds | | U.S. Pat. No. 7,250,226, U.S. Pat. No. 7,396,598 |

TABLE 1-continued
| MATERIAL | EXAMPLES OF MATERIAL | PUBLICATIONS |
| --- | --- | --- |
| Pt(II) organometallic complexes, including polydentated ligands | 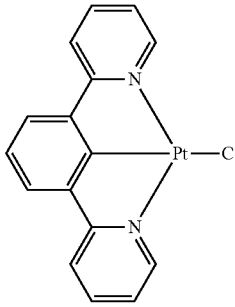 | Appl. Phys. Lett. 86, 153505 (2005) |
| | 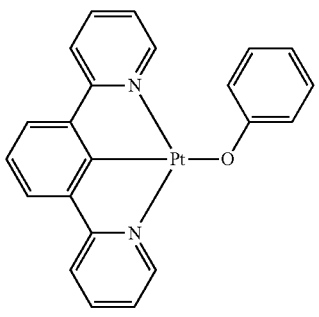 | Appl. Phys. Lett. 86, 153505 (2005) |
| | 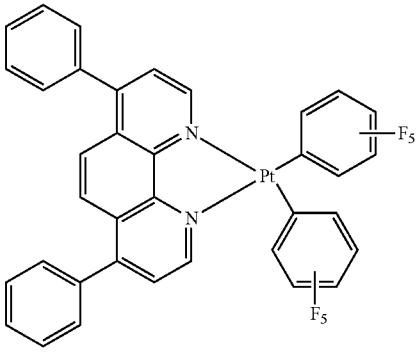 | Chem. Lett. 34, 592 (2005) |
| | 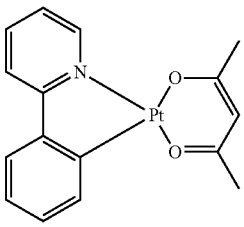 | WO2002015645 |
| | 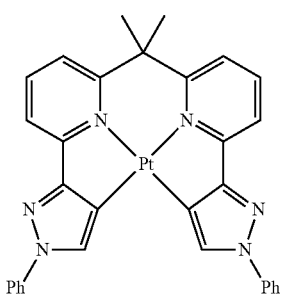 | US20060263635 |

TABLE 1-continued
| MATERIAL | EXAMPLES OF MATERIAL | PUBLICATIONS |
|---|---|---|
| Cu complexes | 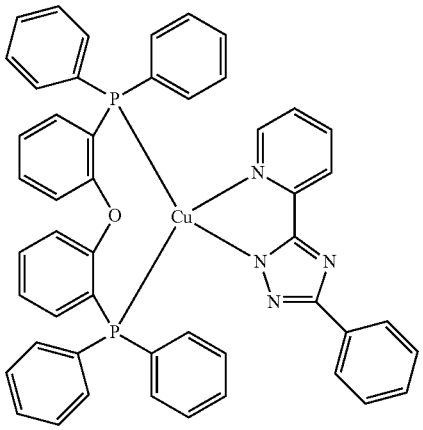 | WO2009000673 |
| Gold complexes | 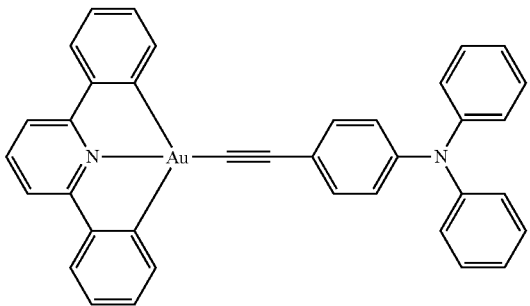 | Chem. Commun. 2906 (2005) |
| Rhenium(III) complexes | 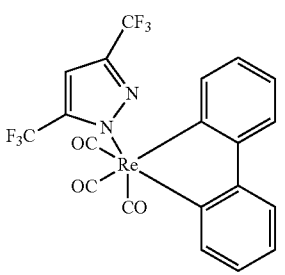 | Inorg. Chem. 42, 1248 (2003) |
| Deuterated organometallic complexes | 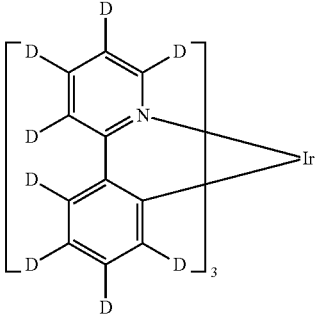 | US20030138657 |

TABLE 1-continued
| MATERIAL | EXAMPLES OF MATERIAL | PUBLICATIONS |
|---|---|---|
| Organometallic complexes with two or more metal centers | 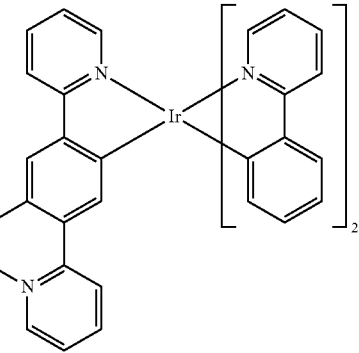 | US20030152802 |
| | 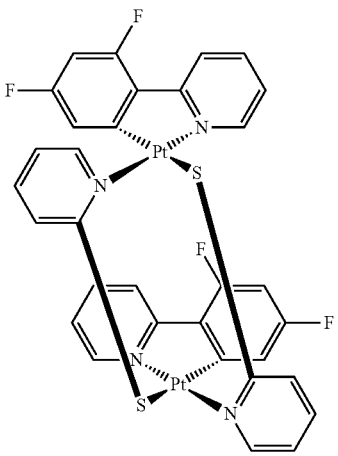 | U.S. Pat. No. 7,090,928 |
| Blue dopants | | |
| Iridium(III) organometallic complexes | 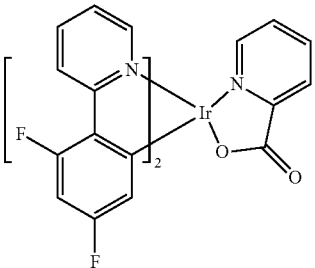 | WO2002002714 |
| | 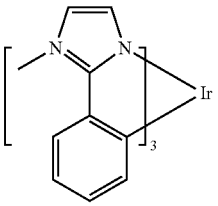 | WO2006009024 |
| | 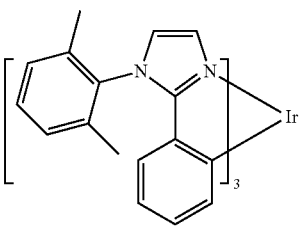 | US20060251923 |

TABLE 1-continued

| MATERIAL | EXAMPLES OF MATERIAL | PUBLICATIONS |
| --- | --- | --- |
| | | U.S. Pat. No. 7,393,599, WO2006056418, US20050260441, WO2005019373 |
| | | U.S. Pat. No. 7,534,505 |
| | | U.S. Pat. No. 7,445,855 |
| | | US20070190359, US20080297033 |
| | | U.S. Pat. No. 7,338,722 |
| | | US20020134984 |

TABLE 1-continued

| MATERIAL | EXAMPLES OF MATERIAL | PUBLICATIONS |
|---|---|---|
| | | Angew. Chem. Int. Ed. 47, 1 (2008) |
| | | Chem. Mater. 18, 5119 (2006) |
| | | Inorg. Chem. 46, 4308 (2007) |
| | | WO2005123873 |
| | | WO2005123873 |
| | | WO2007004380 |

TABLE 1-continued

| MATERIAL | EXAMPLES OF MATERIAL | PUBLICATIONS |
|---|---|---|
| | | WO2006082742 |
| Osmium(II) complexes | | U.S. Pat. No. 7,279,704 |
| | | Organometallics 23, 3745 (2004) |
| Gold complexes | | Appl. Phys. Lett. 74, 1361 (1999) |
| Platinum(II) complexes | | WO2006098120, WO2006103874 |

TABLE 1-continued

| MATERIAL | EXAMPLES OF MATERIAL | PUBLICATIONS |
|---|---|---|
| Exciton/hole blocking layer materials | | |
| Bathocuprine compounds (e.g., BCP, BPhen) | 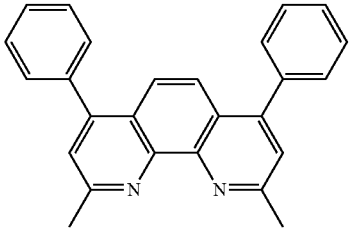 [SMILES: Cc1cc(-c2ccccc2)c2ccc3c(-c4ccccc4)cc(C)nc3c2n1] | Appl. Phys. Lett. 75, 4 (1999) |
| | 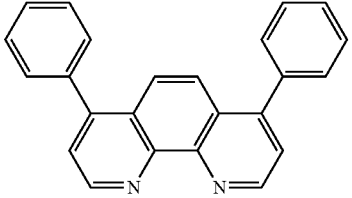 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 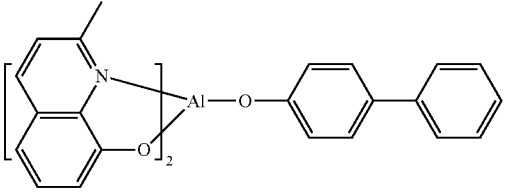 | Appl. Phys. Lett. 81, 162 (2002) |
| 5-member ring electron deficient heterocycles such as triazole, oxadiazole, imidazole, benzoimidazole | 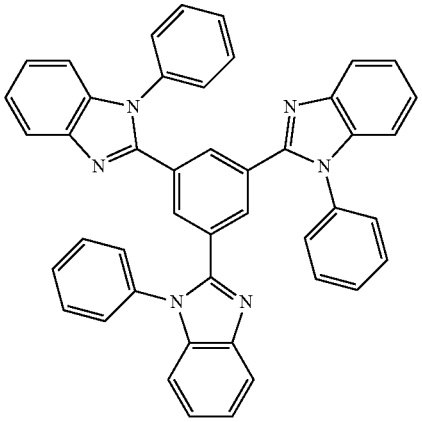 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 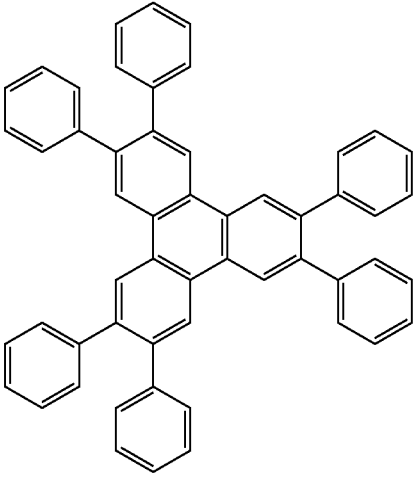 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

TABLE 1-continued
| MATERIAL | EXAMPLES OF MATERIAL | PUBLICATIONS |
|---|---|---|
| Fluorinated aromatic compounds | 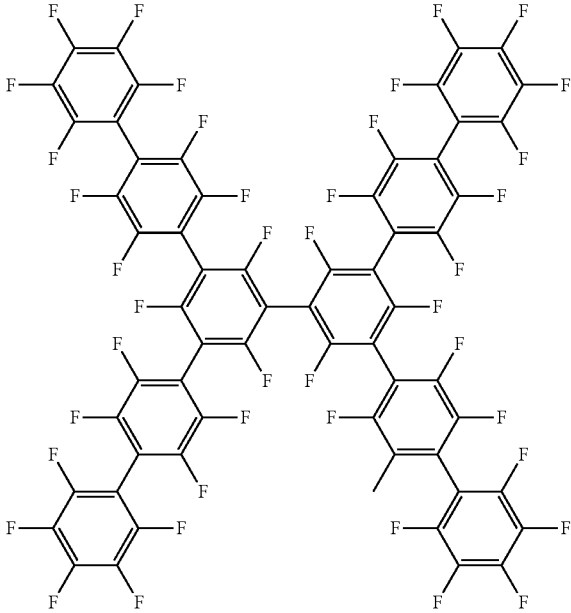 [SMILES: Cc1c(F)c(-c2c(F)c(-c3c(F)c(F)c(-c4c(F)c(F)c(F)c(F)c4F)c(F)c3F)c(F)c(-c3c(F)c(-c4c(F)c(F)c(-c5c(F)c(F)c(F)c(F)c5F)c(F)c4F)c(F)c(-c4c(F)c(F)c(-c5c(F)c(F)c(F)c(F)c5F)c(F)c4F)c3F)c2F)c(F)c(F)c1-c1c(F)c(F)c(F)c(F)c1F] | Appl. Phys. Lett. 79, 156 (2001) |
| Phenothiazine-S-oxide | 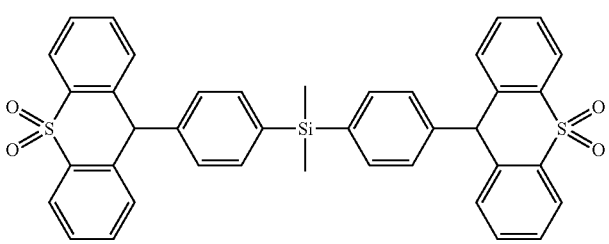 [SMILES: C[Si](C)(c1ccc(C2c3ccccc3S(=O)(=O)c3ccccc32)cc1)c1ccc(C2c3ccccc3S(=O)(=O)c3ccccc32)cc1] | WO2008132085 |
| Electron transporting materials | | |
| Anthracene-benzoimidazole compounds | 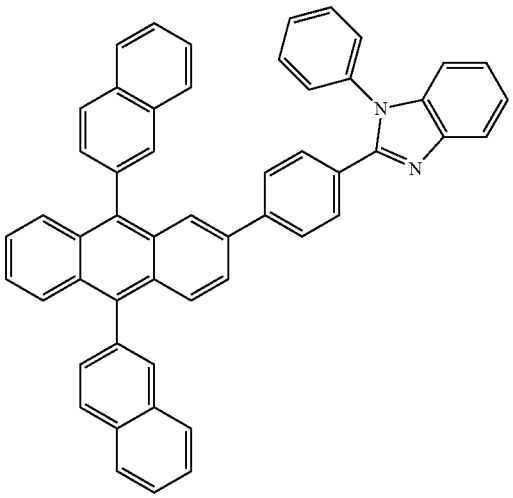 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1] | WO2003060956 |

TABLE 1-continued
| MATERIAL | EXAMPLES OF MATERIAL | PUBLICATIONS |
|---|---|---|
| | 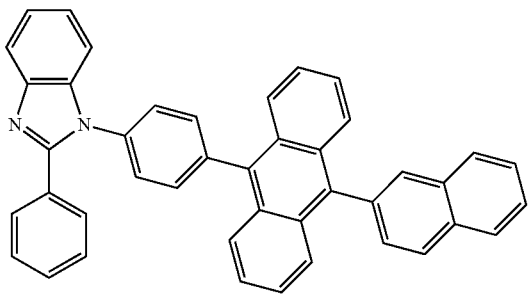 [SMILES: c1ccc(-c2nc3ccccc3n2-c2ccc(-c3c4ccccc4c(-c4ccc5ccccc5c4)c4ccccc34)cc2)cc1] | US20090179554 |
| Aza triphenylene derivatives | 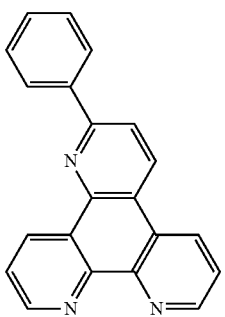 [SMILES: c1ccc(-c2ccc3c4cccnc4c4ncccc4c3n2)cc1] | US20090115316 |
| Anthracene-benzothiazole compounds | 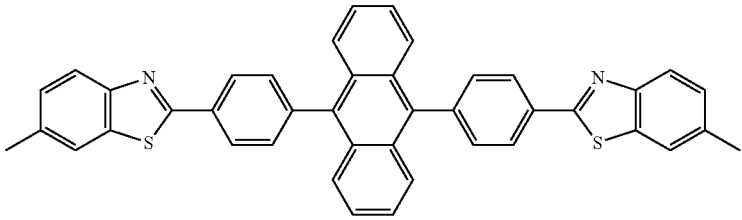 | Appl. Phys. Lett. 89, 063504 (2006) |
| Metal 8-hydroxyquinolates (e.g., Alq$_3$, Zrq$_4$) | 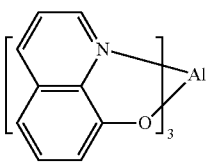 | Appl. Phys. Lett. 51, 913 (1987)<br>U.S. Pat. No. 7,230,107 |
| Metal hydroxybenoquinolates | 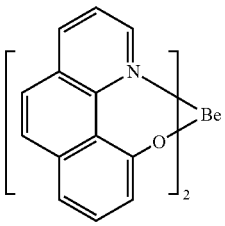 | Chem. Lett. 5, 905 (1993) |
| Bathocuprine compounds such as BCP, BPhen, etc | 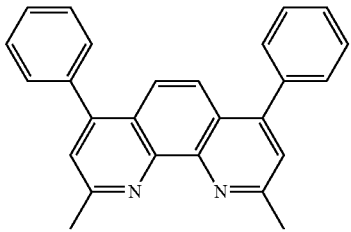 [SMILES: Cc1cc(-c2ccccc2)c2ccc3c(-c4ccccc4)cc(C)nc3c2n1] | Appl. Phys. Lett. 91, 263503 (2007) |

TABLE 1-continued
| MATERIAL | EXAMPLES OF MATERIAL | PUBLICATIONS |
|---|---|---|
| | 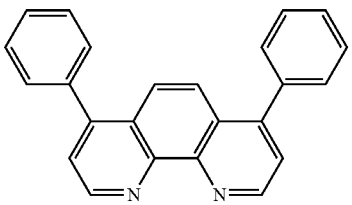 [SMILES: c1ccc(-c2ccnc3c2ccc2c(-c4ccccc4)ccnc23)cc1] | Appl. Phys. Lett. 79, 449 (2001) |
| 5-member ring electron deficient heterocycles (e.g., triazole, oxadiazole, imidazole, benzoimidazole) | 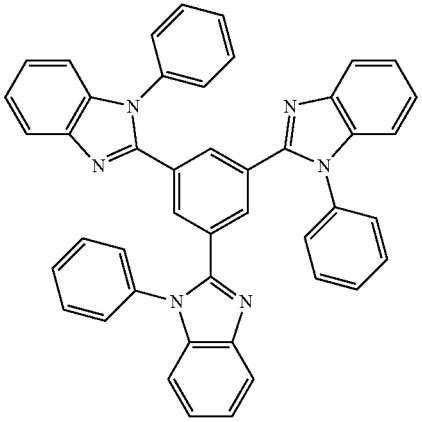 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 74, 865 (1999) |
| | 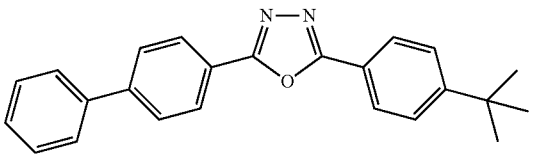 [SMILES: CC(C)(C)c1ccc(-c2nnc(-c3ccc(-c4ccccc4)cc3)o2)cc1] | Appl. Phys. Lett. 55, 1489 (1989) |
| | 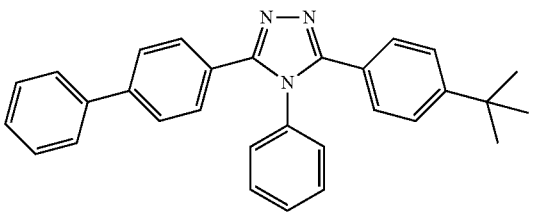 [SMILES: CC(C)(C)c1ccc(-c2nnc(-c3ccc(-c4ccccc4)cc3)n2-c2ccccc2)cc1] | Jpn. J. Apply. Phys. 32, L917 (1993) |
| Silole compounds | 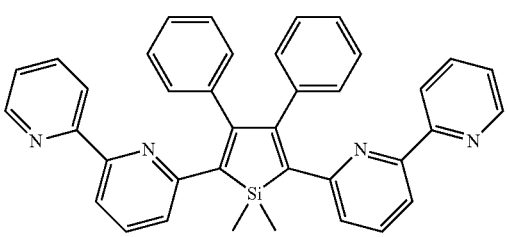 [SMILES: C[Si]1(C)C(c2cccc(-c3ccccn3)n2)=C(c2ccccc2)C(c2ccccc2)=C1c1cccc(-c2ccccn2)n1] | Org. Electron. 4, 113 (2003) |
| Arylborane compounds | 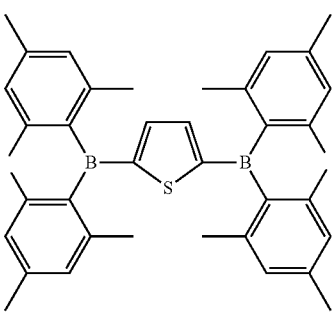 [SMILES: Cc1cc(C)c(B(c2ccc(B(c3c(C)cc(C)cc3C)c3c(C)cc(C)cc3C)s2)c2c(C)cc(C)cc2C)c(C)c1] | J. Am. Chem. Soc. 120, 9714 (1998) |

TABLE 1-continued

| MATERIAL | EXAMPLES OF MATERIAL | PUBLICATIONS |
| --- | --- | --- |
| Fluorinated aromatic compounds | | J. Am. Chem. Soc. 122, 1832 (2000) |
| Fullerene (e.g., C60) | | US20090101870 |
| Triazine complexes | | US20040036077 |
| Zn (N^N) complexes | | U.S. Pat. No. 6,528,187 |

Measured Results

Two emitters are placed into a device EML and caused to emit simultaneously. λ1 is the maximum wavelength of emitter 1 when not combined with another emitter. λ2 is the maximum wavelength of emitter 2 when not combined with another emitter. λ1>λ2. Then, λ3, the maximum wavelength of the resulting emission (λ1>λ3>λ2) can be tuned by relative concentrations of the emitters 1 and 2. Devices were fabricated and spectra measured for a variety of different combinations of emitters. EL (electroluminescent) properties for the various emitters used in the experiments are shown in Table 2

TABLE 2

EL properties of the emitters used in the device examples

| Emitter | 1931 CIE x | 1931 CIE Y | λ max [nm] | FWHM [nm] |
|---|---|---|---|---|
| A | 0.321 | 0.626 | 524 | 64 |
| B | 0.428 | 0.554 | 552 | 84 |
| C | 0.647 | 0.350 | 618 | 72 |
| D | 0.688 | 0.308 | 630 | 52 |

EXAMPLE 1

Figure 3:
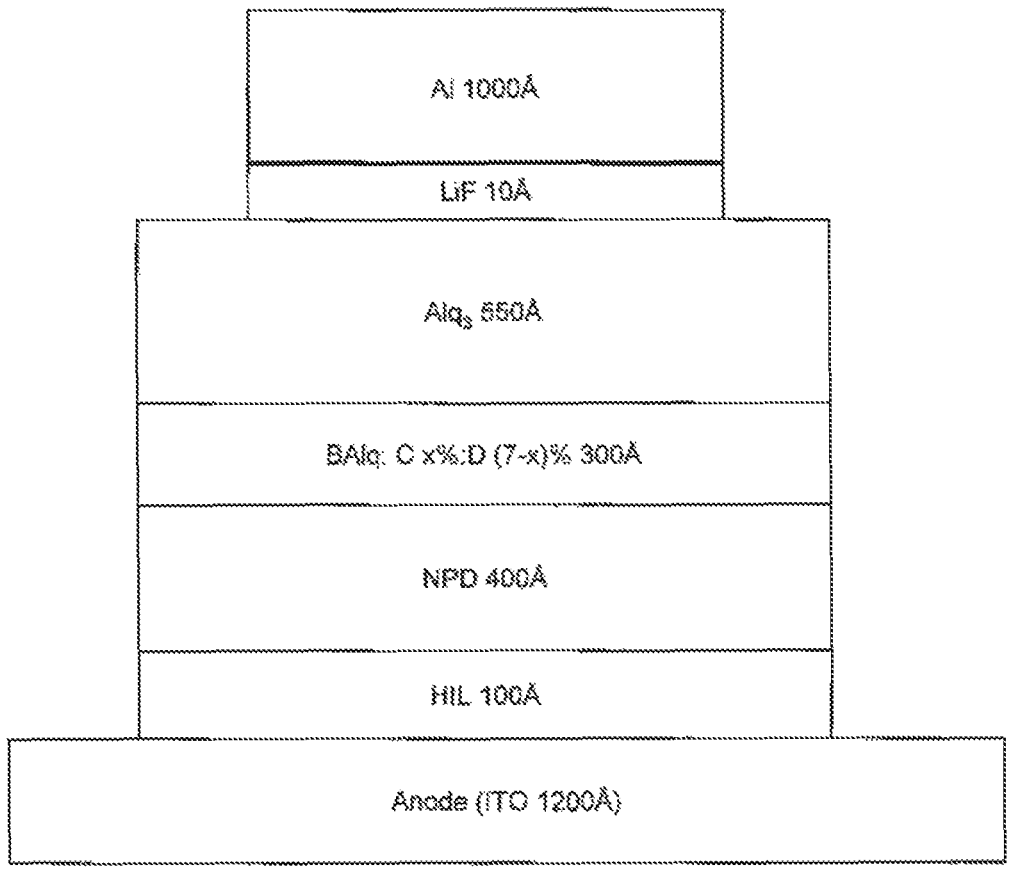
FIG. 3 shows a schematic structure of devices that were fabricated having variable [%] of emitters C and D, used with Example 1.

FIG. 3 shows a schematic structure of devices that were fabricated having variable [%] of emitters C and D, used with Example 1.

Example 1 is based on devices having 2 emitters, C and D, deposited into the device EML in a variety of ratios, but with total concentration of the emitters constant C[%]+D [%]=7%. The devices EL is shown (FIG. 4) and the devices performance is summarized in Table 3:

TABLE 3

EL, JVL, LT performance of the devices Example 1 with variable [%] of emitters C and D

| Example 1 | | | | | | At 1,000 nits | | | | At 10,000 nits | At 40 mA/cm² | |
|---|---|---|---|---|---|---|---|---|---|---|---|---|
| CD | | 1931 CIE | | $\lambda_{max}$ | FWHM | Voltage | LE | EQE | PE | $LT_{97\%}$ | $L_0$ | $LT_{97\%}$ |
| C % | D % | x | y | [nm] | [nm] | [V] | [cd/A] | [%] | [lm/W] | [h]* | [nits] | [h] |
| 0 | 7 | 0.690 | 0.307 | 630 | 50 | 8.7 | 13 | 18.8 | 4.7 | 2 | 4,145 | 8 |
| 1 | 6 | 0.689 | 0.309 | 630 | 52 | 8.7 | 14 | 19.8 | 5.1 | 2 | 4,482 | 10 |
| 3 | 4 | 0.684 | 0.313 | 628 | 52 | 8 | 15.2 | 20.4 | 5.9 | 4 | 4,920 | 16 |
| 4 | 3 | 0.680 | 0.318 | 628 | 52 | 8.1 | 16.3 | 20.4 | 6.3 | 12 | 5,182 | 38 |
| 6 | 1 | 0.668 | 0.329 | 626 | 58 | 7.9 | 18.1 | 19.7 | 7.2 | 19 | 5,834 | 50 |
| 6.25 | 0.75 | 0.662 | 0.335 | 624 | 62 | 7.4 | 19 | 18.8 | 8.1 | 11 | 6,092 | 28 |
| 6.5 | 0.5 | 0.659 | 0.338 | 622 | 64 | 7.3 | 19.8 | 18.9 | 8.6 | 30 | 6,503 | 66 |
| 6.75 | 0.25 | 0.654 | 0.343 | 622 | 70 | 7.2 | 20.3 | 18.1 | 8.9 | 18 | 6,680 | 38 |
| 7 | 0 | 0.647 | 0.350 | 618 | 72 | 7.4 | 20.9 | 17 | 8.9 | 18 | 6,898 | 35 |

*Calculated assuming acceleration factor 1.8

Figure 4:
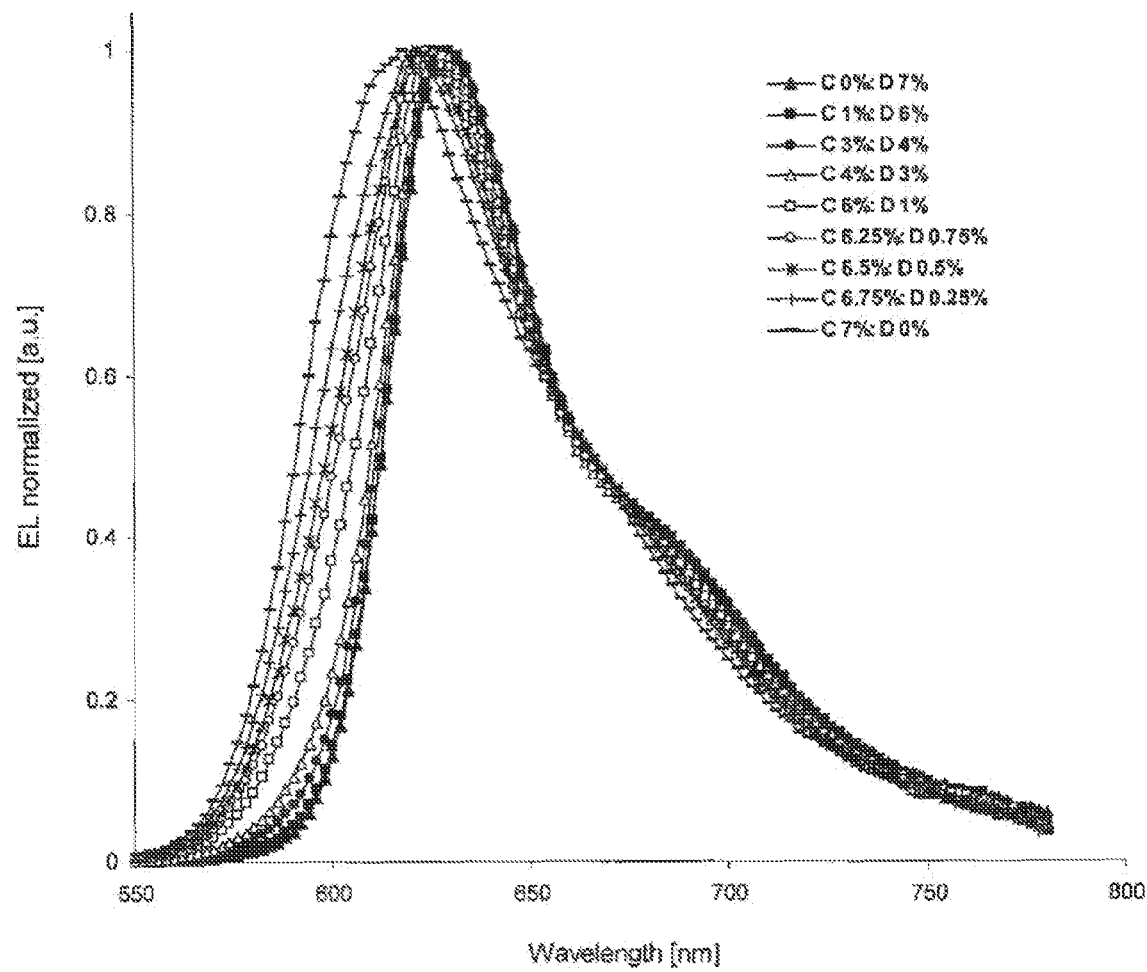
FIG. 4 shows electroluminescent (EL) spectra of the devices of Example 1.

FIG. 4 shows electroluminescent (EL) spectra of the devices of Example 1.

Figure 5:
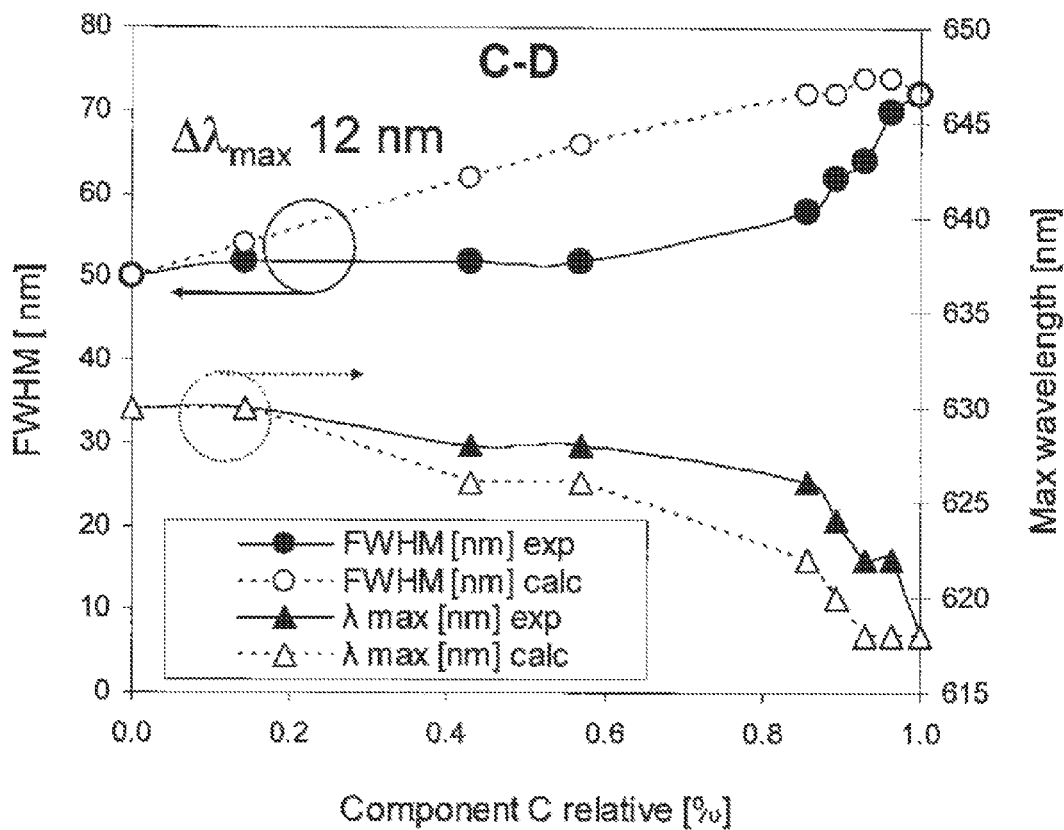
FIG. 5 shows maximum wavelength and full width half maximum (FWHM) values for the devices of Example 1. Both measured experimental data and results calculated by adding spectra proportional to emitter concentration are shown.

FIG. 5 shows maximum wavelength and full width half maximum (FWHM) values for the devices of Example 1. Both measured experimental data and results calculated by adding spectra proportional to emitter concentration are shown.

Figure 6:
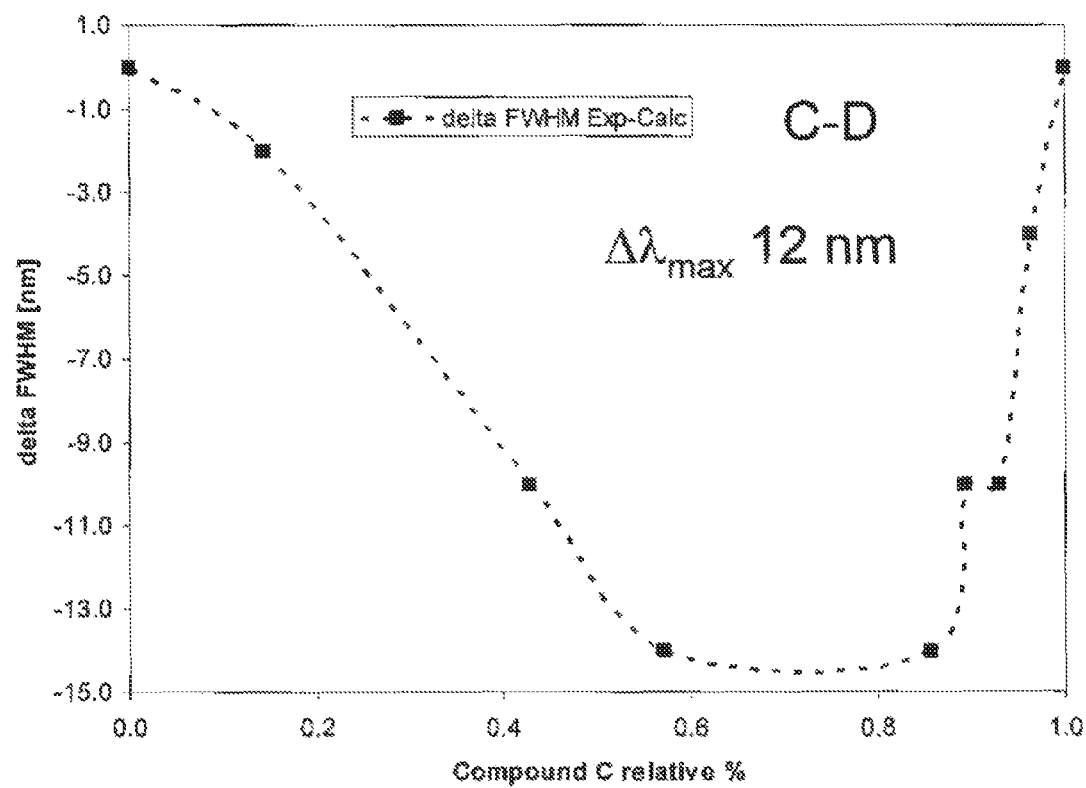
FIG. 6 shows the FWHM difference (experimental vs. calculated) values for the devices of Example 1.

FIG. 6 shows the FWHM difference (experimental vs. calculated) values for the devices of Example 1.

Example 1 (and the other examples) show the following:

The resulting experimental EL spectra of the devices measured in the examples is significantly narrower as compared to theoretically calculated superimposed EL spectra of individual emitters C and D (for Example 1, see FIGS. 5 and 6). A similar narrowing is also observed in Examples 3, 4, and 5, but not in Example 2. This narrowing is an unexpected result, which is opposite to results expected as described in many references (see below), where a broad emission spectra was obtained by placing 2 emitters in one emissive layer.

High-Brightness White Organic Light-Emitting Diodes Featuring a Single Emission Layer. Chang, Mei-Ying; Wu, Chun-Chih; Lin, Shih-Chin; Chen, Yi-Fan. Journal of the Electrochemical Society (2009), 156(1), J1-J5.

Broad wavelength modulating and design of organic white diode based on lighting by using exciplex emission from mixed acceptors. Wang, D.; Li, W. L.; Su, Z. S.; Li, T. L.; Chu, B.; Bi, D. F.; Chen, L. L.; Su, W. M.; He, H. Applied Physics Letters (2006), 89(23), 233511/1-233511/3.

High-efficiency single dopant white electrophosphorescent light-emitting diodes. Adamovich, Vadim; Brooks, Jason; Tamayo, Arnold; Alexander, Alex M.; Djurovich, Peter I.; D'Andrade, Brian W.; Adachi, Chihaya; Forrest, Stephen R.; Thompson, Mark E. New Journal of Chemistry (2002), 26(9), 1171-1178.

White emission from a single-component single-layer solution processed OLED. Coya, Carmen; Ramos, Maria M.; Luna, Xenia; Alvarez, Angel Luis; de Andres, Alicia; Blanco, Raul; Juarez, Rafael; Gomez, Rafael; Segura, Jose Luis Proceedings of SPIE (2009), 7415(Organic Light Emitting Materials and Devices XIII), 74151P/1-74151P/12.

Efficient, color-stable fluorescent white organic light-emitting diodes with single emission layer by vapor deposition from solvent premixed deposition source. Jou, Jwo-Huei; Chiu, Yung-Sheng; Wang, Chung-Pei; Wang, Ren-Yang; Hu, Huei-Ching. Applied Physics Letters (2006), 88(19), 193501/1-193501/3.

Efficient pure-white organic light-emitting diodes with a solution-processed, binary-host employing single emission layer. Jou, Jwo-Huei; Sun, Ming-Chen; Chou, Hung-Hsing; Li, Chien-Hung. Applied Physics Letters (2006), 88(14), 141101/1-141101/3.

White light emission from a single layer organic light emitting diode fabricated by spincoating. Yang, J. P.; Jin, Y. D.; Heremans, P. L.; Hoefnagels, R.; Dieltiens, P.; Blockhuys, F.; Geise, H. J.; Van der Auweraer, M.; Borghs, G. Chemical Physics Letters (2000), 325(1,2,3), 251-256.

Table 3 and FIGS. 4 and 5 illustrate that maximum wavelength, FWHM, and device CIE can be fine tuned in a predictable way within a range defined by individual emitters C and D by the changing of the relative % of emitters C and D in the device EML.

Examples 2, 3, 4 and 5 show results similar to those of Example 1, but for different combinations of emitters.

EXAMPLE 2

Figure 7:
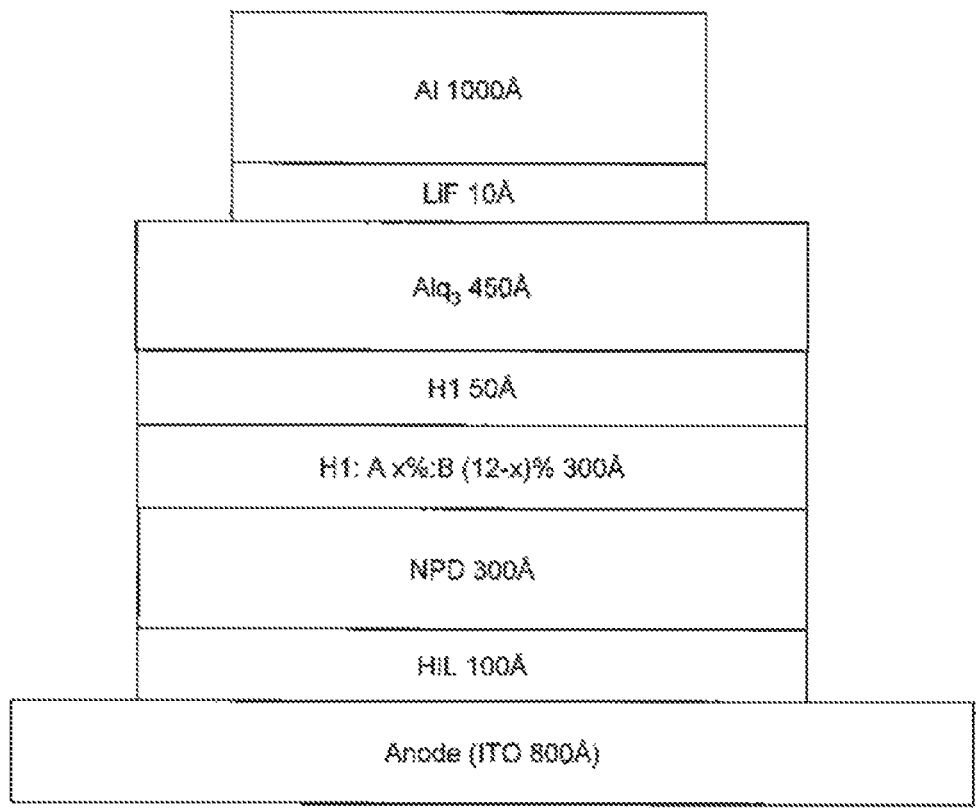
FIG. 7 shows schematic structure for the devices of Example 2 with variable [%] of emitters A and B.

FIG. 7 shows schematic structure for the devices of Example 2 with variable [%] of emitters A and B.

Figure 8:
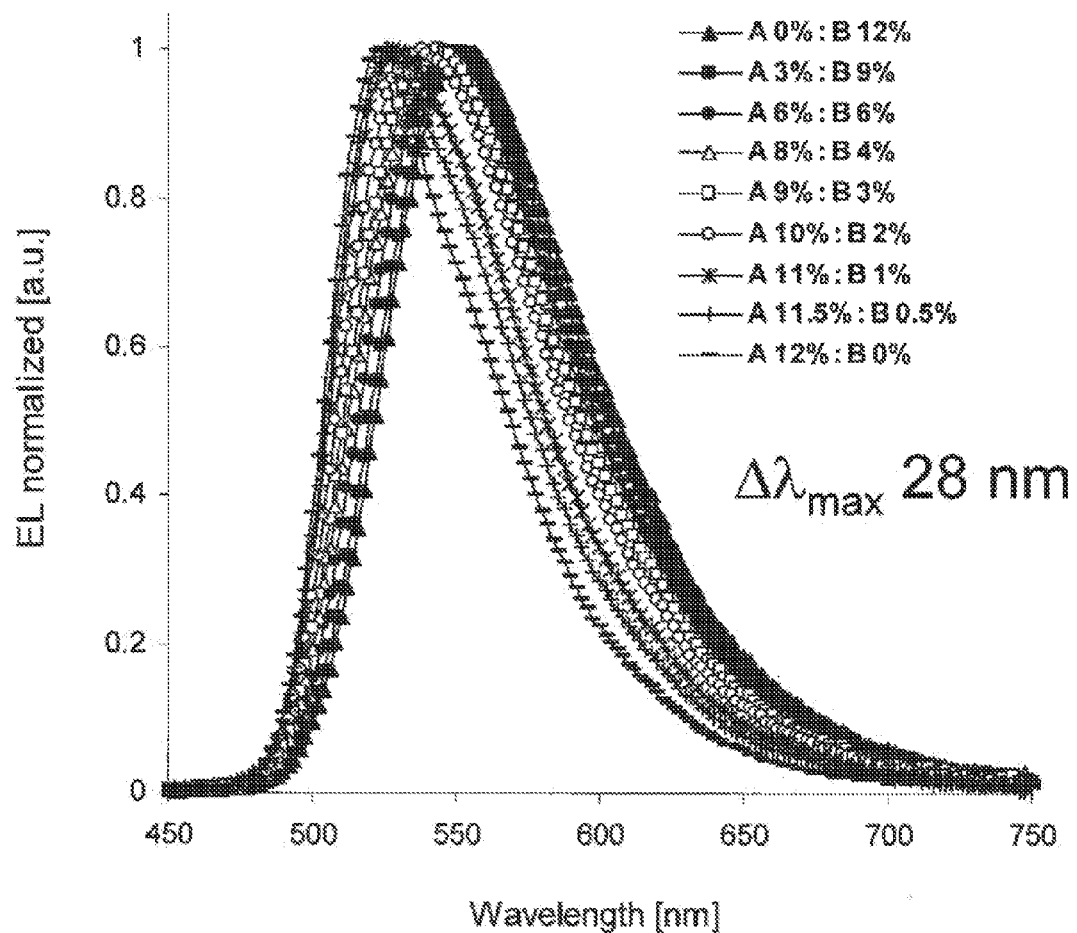
FIG. 8 shows EL spectra of the devices of Example 2 with variable [%] of emitters A and B.

FIG. 8 shows EL spectra of the devices of Example 2 with variable [%] of emitters A and B.

Figure 9:
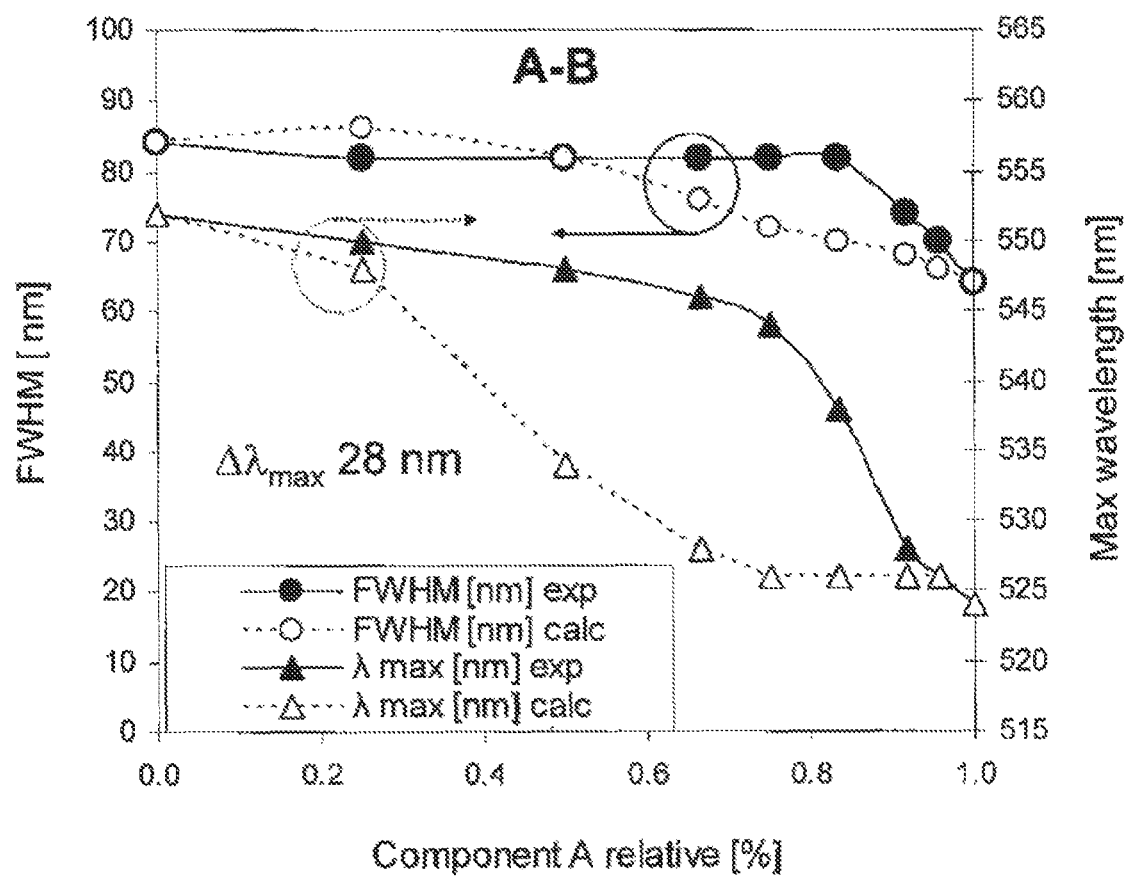
FIG. 9 shows maximum wavelength and FWHM values for the devices in Example 2 with variable [%] of emitters A and B. Both measured experimental data and results calculated by adding spectra proportional to emitter concentration are shown.

FIG. 9 shows maximum wavelength and FWHM values for the devices in Example 2 with variable [%] of emitters A and B. Both measured experimental data and results calculated by adding spectra proportional to emitter concentration are shown.

Table 4 shows EL, JVL, and LT performance of the devices of Example 2 with variable [%] of emitters A and B.

TABLE 4

EL, JVL, LT performance of the devices Example 2, with variable [%] of emitters A and B

| Example 2 | | | | | | | At 1,000 nits | | | | At 10,000 nits | At 40 mA/cm² | |
|---|---|---|---|---|---|---|---|---|---|---|---|---|---|
| AB | | 1931 CIE | | $\lambda_{max}$ | FWHM | Voltage | LE | EQE | PE | $LT_{97\%}$ | $L_0$ | $LT_{97\%}$ | |
| A % | B % | x | y | [nm] | [nm] | [V] | [cd/A] | [%] | [lm/W] | [h]* | [nits] | [h] | |
| 0 | 12 | 0.428 | 0.554 | 552 | 84 | 5.9 | 47.6 | 14.2 | 25.2 | 224 | 14,494 | 115 | |
| 3 | 9 | 0.421 | 0.560 | 550 | 82 | 5.7 | 50.4 | 14.9 | 27.7 | 275 | 15,152 | 130 | |
| 6 | 6 | 0.407 | 0.571 | 548 | 82 | 5.6 | 54.6 | 15.9 | 30.7 | 215 | 16,208 | 90 | |
| 8 | 4 | 0.396 | 0.578 | 546 | 82 | 5.4 | 55.9 | 16.2 | 32.3 | 152 | 16,781 | 60 | |
| 9 | 3 | 0.388 | 0.583 | 544 | 82 | 5.4 | 58.1 | 16.7 | 33.6 | 145 | 17,123 | 55 | |
| 10 | 2 | 0.375 | 0.592 | 538 | 82 | 5.3 | 57.6 | 16.2 | 34.4 | 174 | 17,264 | 65 | |
| 11 | 1 | 0.354 | 0.606 | 528 | 74 | 5.3 | 58.9 | 16.6 | 35.1 | 108 | 17,400 | 40 | |
| 11.5 | 0.5 | 0.341 | 0.614 | 526 | 70 | 5.2 | 57.5 | 16.1 | 34.8 | 67 | 17,038 | 26 | |
| 12 | 0 | 0.321 | 0.626 | 524 | 64 | 5.3 | 57.4 | 16 | 33.8 | 48 | 16,700 | 19 | |

*Calculated assuming acceleration factor 1.8

EXAMPLE 3

Figure 10:
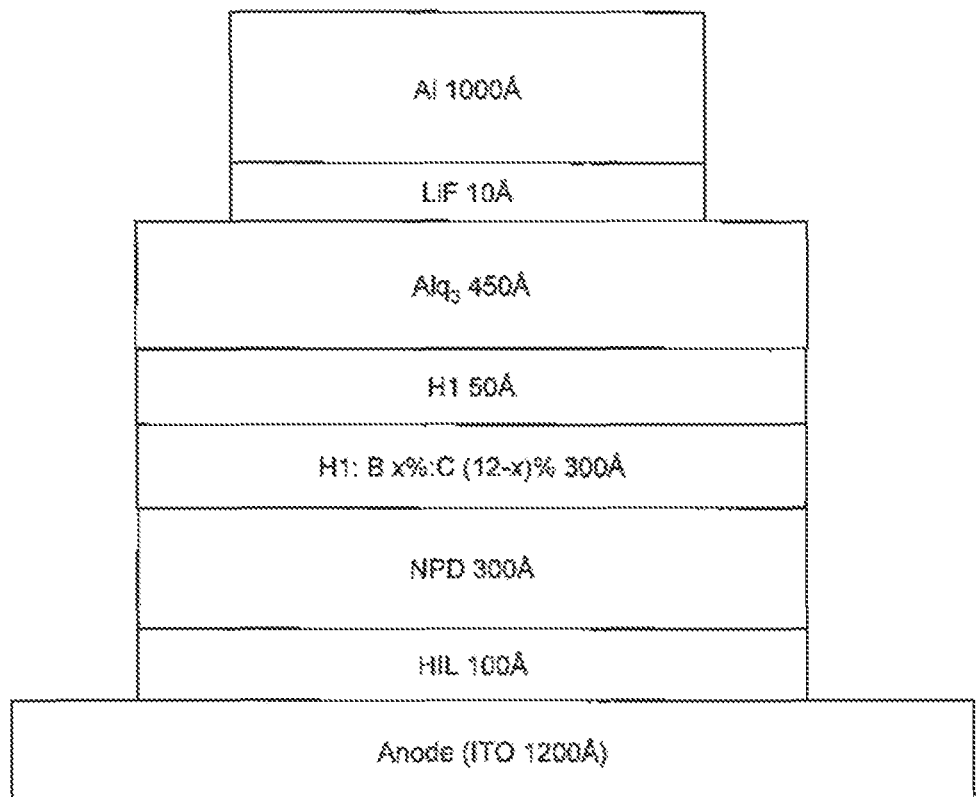
FIG. 10 shows a schematic structure for the devices in Example 3 with variable [%] of emitters B and C.

FIG. 10 shows a schematic structure for the devices in Example 3 with variable [%] of emitters B and C.

Figure 11:
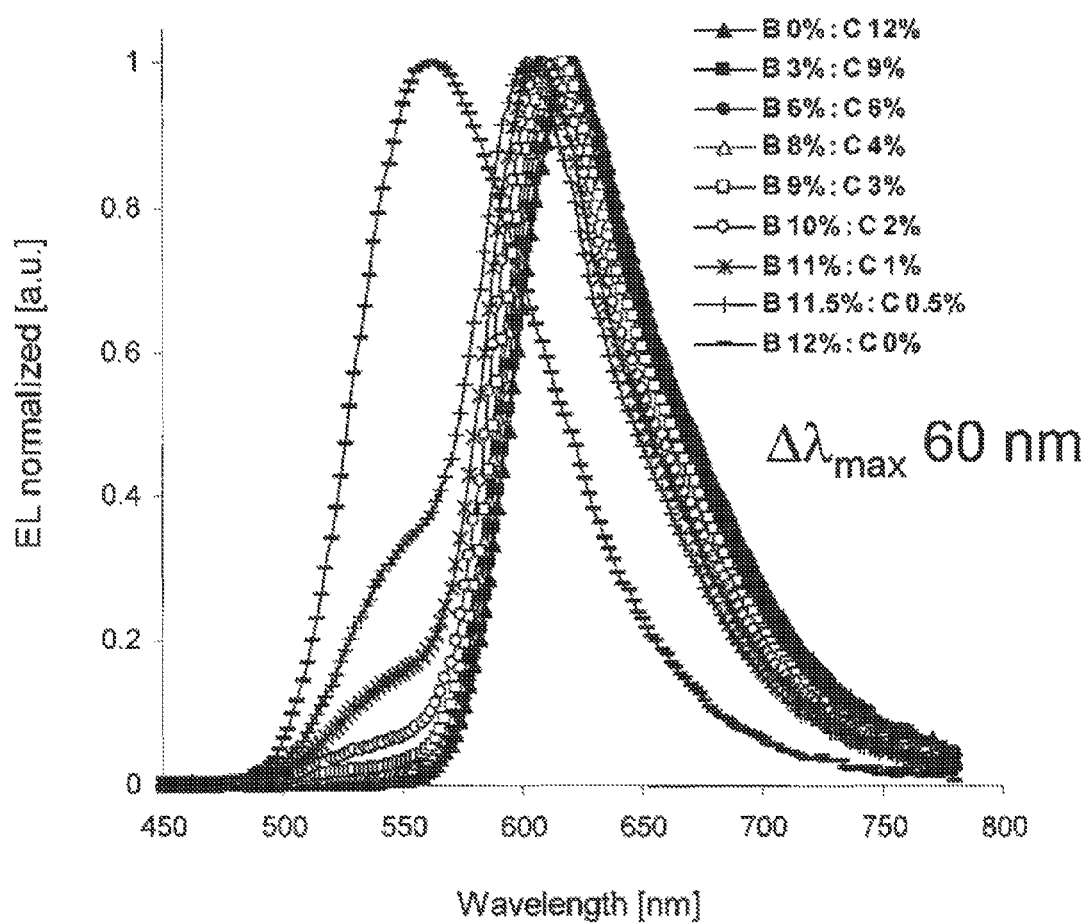
FIG. 11 shows EL spectra for the devices of Example 3 with variable [%] of emitters B and C.

FIG. 11 shows EL spectra for the devices of Example 3 with variable [%] of emitters B and C.

Figure 12:
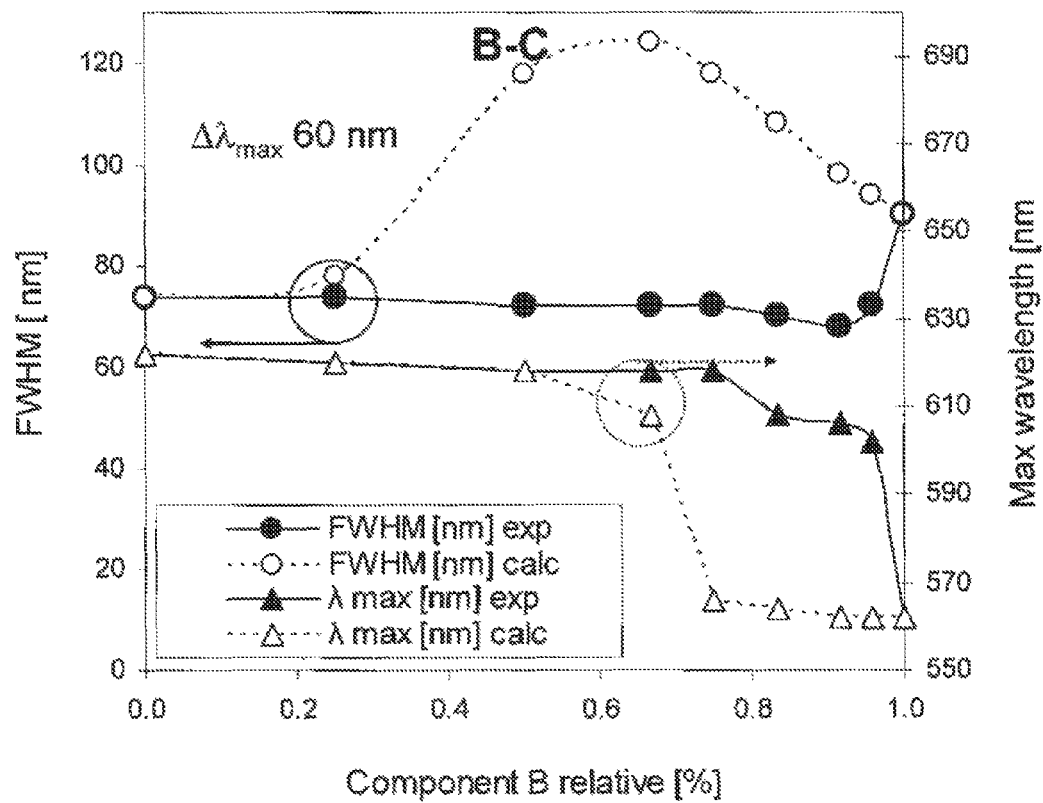
FIG. 12 shows maximum wavelength and FWHM values for the devices of Example 3 with variable [%] of emitters B and C. Both measured experimental data and results calculated by adding spectra proportional to emitter concentration are shown.

FIG. 12 shows maximum wavelength and FWHM values for the devices of Example 3 with variable [%] of emitters B and C. Both measured experimental data and results calculated by adding spectra proportional to emitter concentration are shown.

Table 5 shows EL, JVL, and LT performance of the devices of Example 3 with variable [%] of emitters B and C.

TABLE 5

EL, JVL, LT performance of the devices Example 3 with variable [%] of emitters B and C

| Example 3 | | | | | | | At 1,000 nits | | | | At 10,000 nits | At 40 mA/cm² | |
|---|---|---|---|---|---|---|---|---|---|---|---|---|---|
| BC | | 1931 CIE | | $\lambda_{max}$ | FWHM | Voltage | LE | EQE | PE | $LT_{97\%}$ | $L_0$ | $LT_{97\%}$ | |
| B % | C % | x | y | [nm] | [nm] | [V] | [cd/A] | [%] | [lm/W] | [h]* | [nits] | [h] | |
| 0 | 12 | 0.655 | 0.343 | 622 | 74 | 6.7 | 16.6 | 14.9 | 7.7 | 15 | 5,729 | 40 | |
| 3 | 9 | 0.652 | 0.346 | 620 | 74 | 6.9 | 17.8 | 15.4 | 8.0 | 28 | 6,323 | 63 | |
| 6 | 6 | 0.645 | 0.351 | 618 | 72 | 6.9 | 19.2 | 15.5 | 8.7 | 37 | 6,986 | 70 | |
| 8 | 4 | 0.640 | 0.356 | 618 | 72 | 6.8 | 21.3 | 16.3 | 9.9 | 108 | 7,766 | 170 | |
| 9 | 3 | 0.634 | 0.362 | 618 | 72 | 6.7 | 22.8 | 16.6 | 10.6 | 165 | 8,303 | 230 | |
| 10 | 2 | 0.616 | 0.379 | 608 | 70 | 6.7 | 26.4 | 16.9 | 12.4 | 193 | 9,552 | 210 | |
| 11 | 1 | 0.590 | 0.404 | 606 | 68 | 6.5 | 31.2 | 17.2 | 15.1 | 217 | 11,082 | 180 | |
| 11.5 | 0.5 | 0.553 | 0.439 | 602 | 72 | 6.2 | 36.8 | 17.1 | 18.6 | 174 | 12,886 | 110 | |
| 12 | 0 | 0.457 | 0.530 | 562 | 90 | 5.9 | 47.3 | 14.8 | 25.2 | 63 | 15,789 | 28 | |

*Calculated assuming acceleration factor 1.8

EXAMPLE 4

Figure 13:
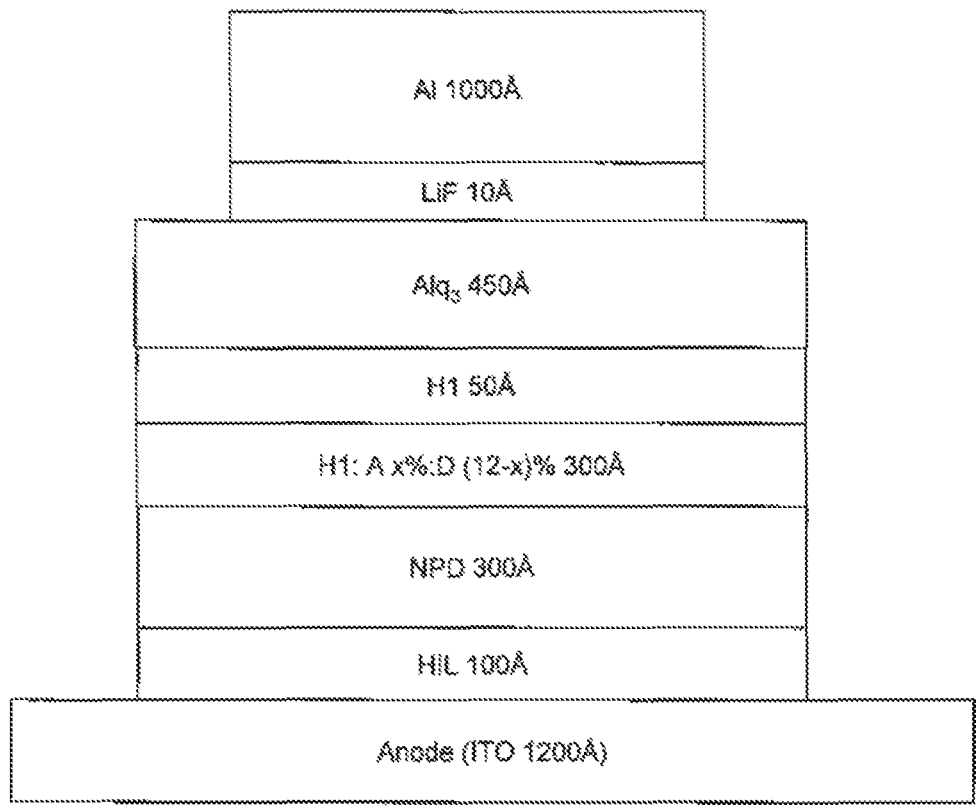
FIG. 13 shows a schematic structure for the devices of Example 4 with variable [%] of emitters A and D.

FIG. 13 shows a schematic structure for the devices of Example 4 with variable [%] of emitters A and D.

Figure 14:
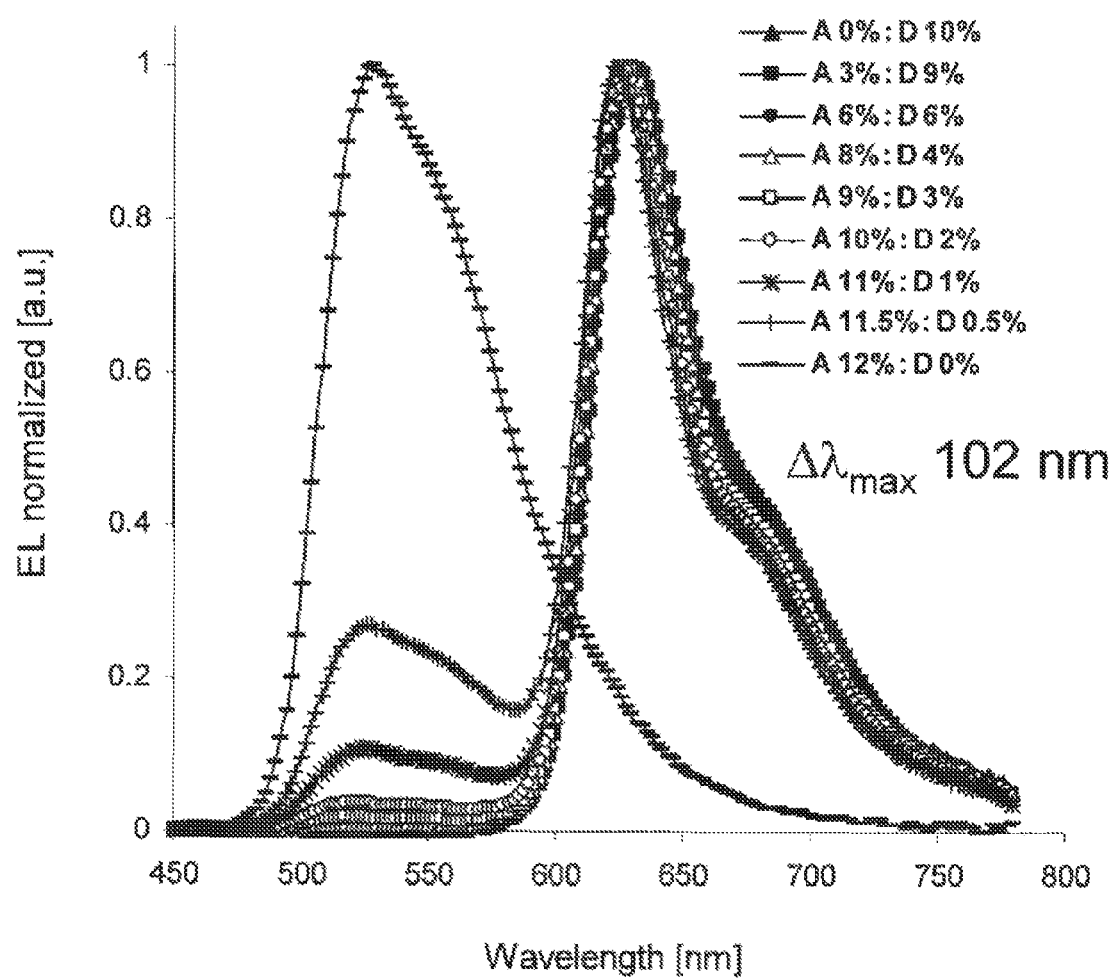
FIG. 14 shows EL spectra for the devices of Example 4 with variable [%] of emitters A and D.

FIG. 14 shows EL spectra for the devices of Example 4 with variable [%] of emitters A and D.

Figure 15:
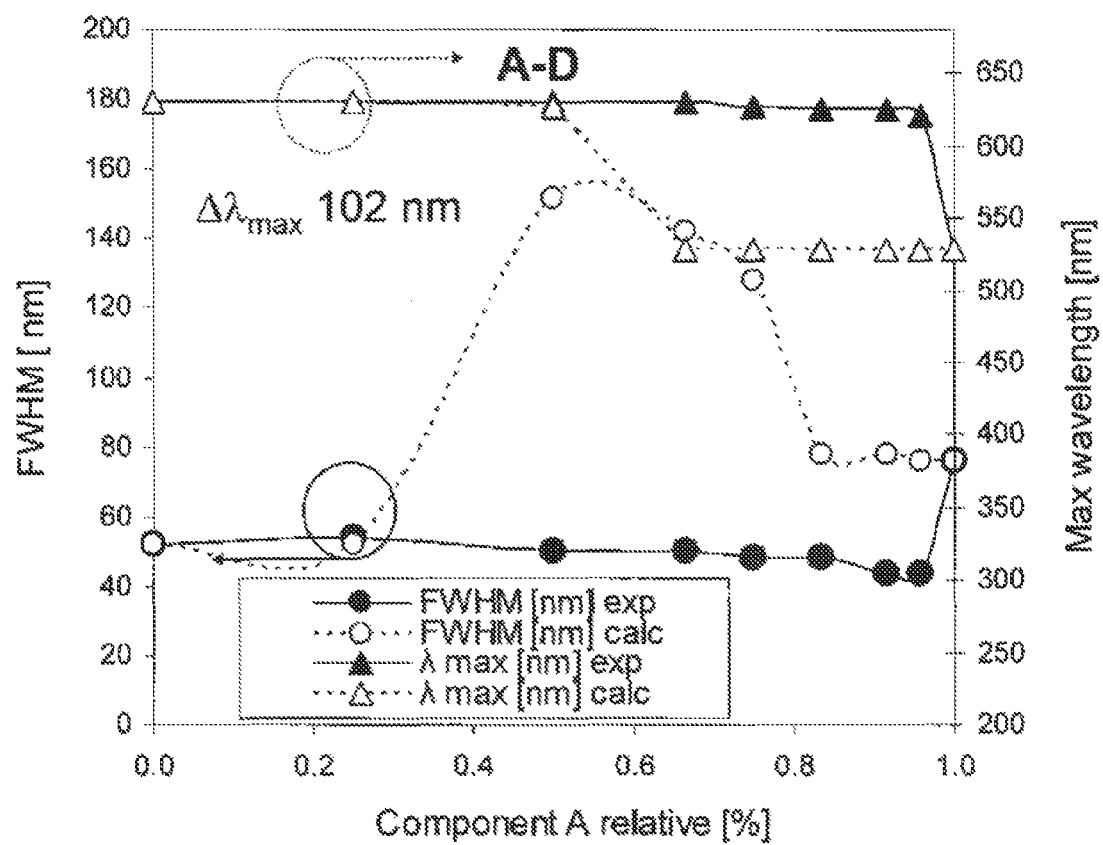
FIG. 15 shows maximum wavelength and FWHM values for the devices of Example 4 with variable [%] of emitters A and D. Both measured experimental data and results calculated by adding spectra proportional to emitter concentration are shown.

FIG. 15 shows maximum wavelength and FWHM values for the devices of Example 4 with variable [%] of emitters A and D. Both measured experimental data and results calculated by adding spectra proportional to emitter concentration are shown.

Table 6 shows EL, JVL, and LT performance of the devices of Example 4 with variable [%] of emitters A and D.

TABLE 6

EL, JVL, LT performance of the devices Example 4 with variable [%] of emitters A and D

| Example 4 | | | | | | | At 1,000 nits | | | | At 10,000 nits | At 40 mA/cm² | |
|---|---|---|---|---|---|---|---|---|---|---|---|---|---|
| AD | | 1931 CIE | | $\lambda_{max}$ | FWHM | Voltage | LE | EQE | PE | $LT_{97\%}$ | $L_0$ | $LT_{97\%}$ | |
| A % | D % | x | y | [nm] | [nm] | [V] | [cd/A] | [%] | [lm/W] | [h]* | [nits] | [h] | |
| 0 | 10 | 0.688 | 0.308 | 630 | 52 | 9.6 | 10.9 | 15.3 | 3.5 | 1 | 3372 | 8 | |
| 3 | 9 | 0.691 | 0.307 | 630 | 54 | 7.8 | 11.8 | 17.1 | 4.7 | 3 | 3,885 | 15 | |

TABLE 6-continued

EL, JVL, LT performance of the devices Example 4 with variable [%] of emitters A and D

| Example 4 | | | | | | At 1,000 nits | | | | At 10,000 nits | At 40 mA/cm$^2$ | |
|---|---|---|---|---|---|---|---|---|---|---|---|---|
| AD | | 1931 CIE | | $\lambda_{max}$ | FWHM | Voltage | LE | EQE | PE | LT$_{97\%}$ | L$_0$ | LT$_{97\%}$ |
| A % | D % | x | y | [nm] | [nm] | [V] | [cd/A] | [%] | [lm/W] | [h]* | [nits] | [h] |
| 6 | 6 | 0.687 | 0.310 | 630 | 50 | 7.7 | 13.3 | 18.8 | 5.4 | 6 | 4,503 | 26 |
| 8 | 4 | 0.681 | 0.315 | 630 | 50 | 7.3 | 14.6 | 19.6 | 6.3 | 11 | 5,057 | 36 |
| 9 | 3 | 0.674 | 0.321 | 628 | 48 | 7.3 | 15.9 | 20.1 | 6.8 | 18 | 5,492 | 52 |
| 10 | 2 | 0.657 | 0.336 | 626 | 48 | 6.9 | 18.2 | 20.6 | 8.3 | 19 | 6,353 | 42 |
| 11 | 1 | 0.614 | 0.375 | 626 | 44 | 6.6 | 23.1 | 20.7 | 11.0 | 17 | 7,850 | 26 |
| 11.5 | 0.5 | 0.548 | 0.434 | 622 | 44 | 6.1 | 29.9 | 19.8 | 15.4 | 10 | 10,020 | 10 |
| 12 | 0 | 0.356 | 0.604 | 528 | 76 | 5.4 | 54.4 | 15.2 | 31.8 | 20 | 16,738 | 8 |

*Calculated assuming acceleration factor 1.8

EXAMPLE 5

Figure 16:
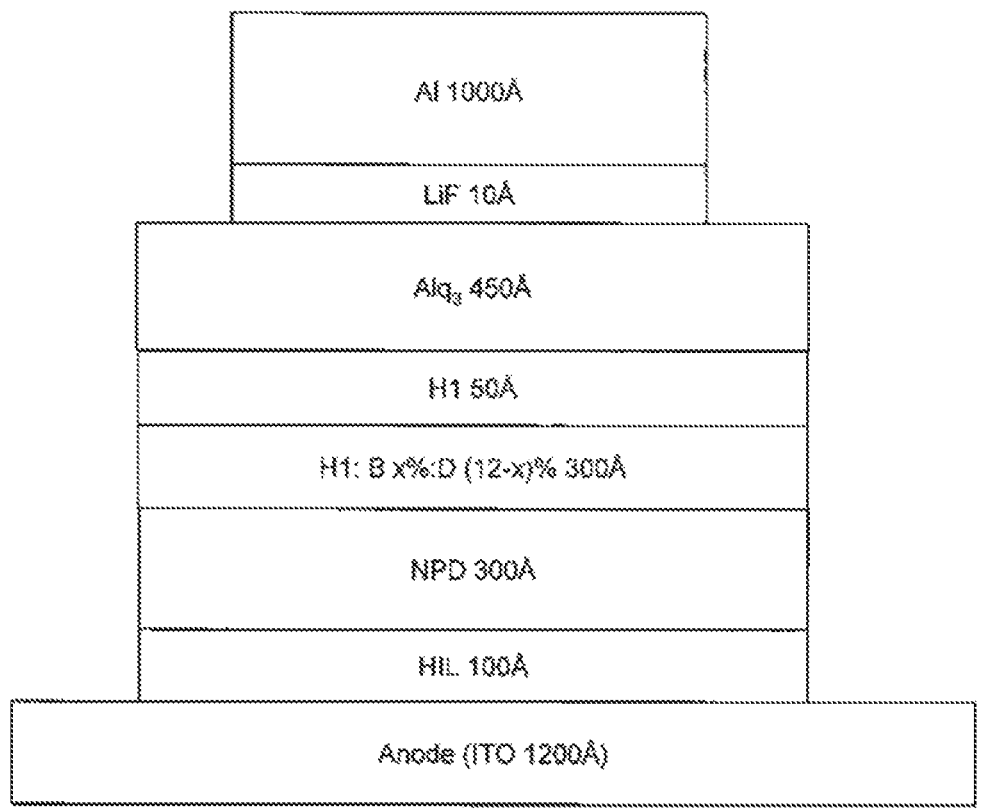
FIG. 16 shows a schematic structure for the devices of Example 5 with variable [%] of emitters B and D.

FIG. 16 shows a schematic structure for the devices of Example 5 with variable [%] of emitters B and D.

Figure 17:
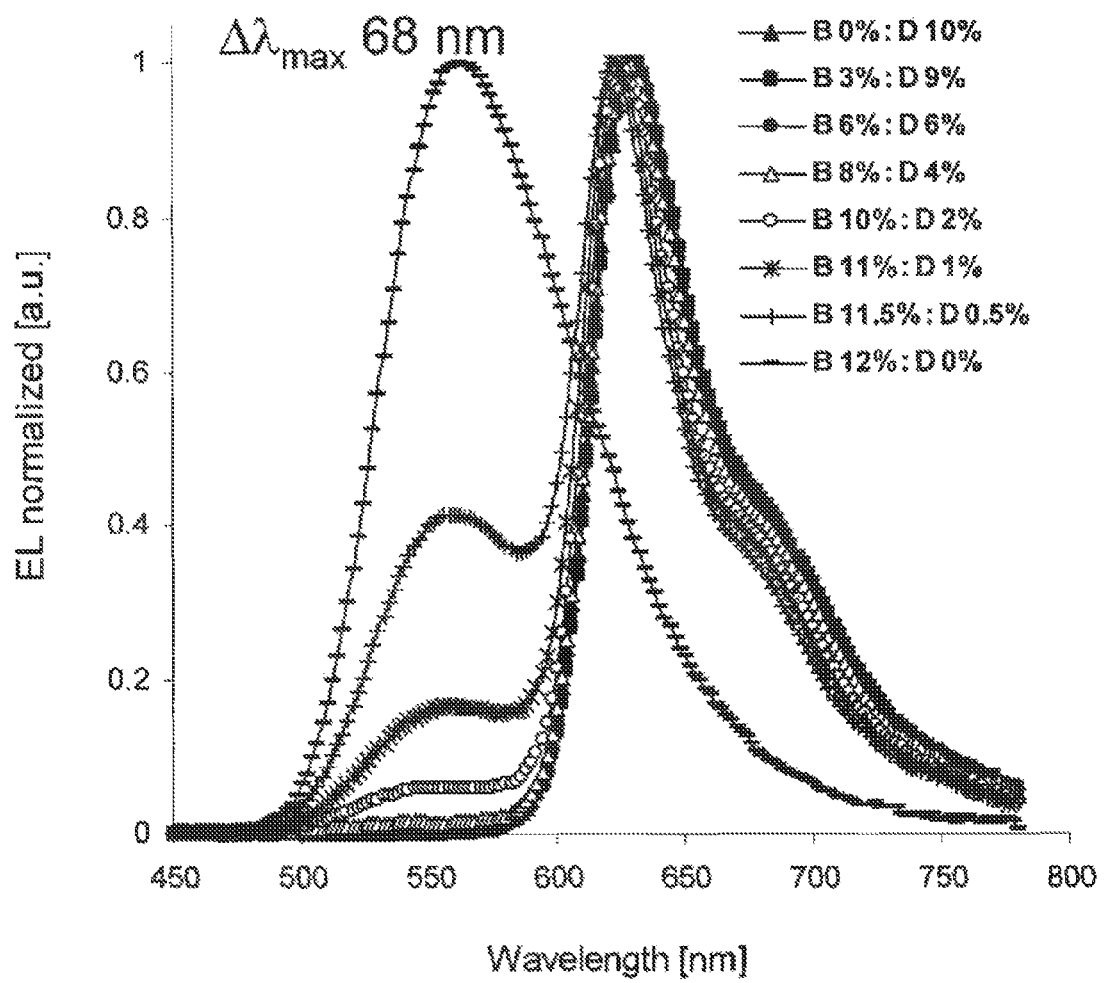
FIG. 17 shows EL spectra for the devices of Example 5 with variable [%] of emitters B and D.

FIG. 17 shows EL spectra for the devices of Example 5 with variable [%] of emitters B and D.

Figure 18:
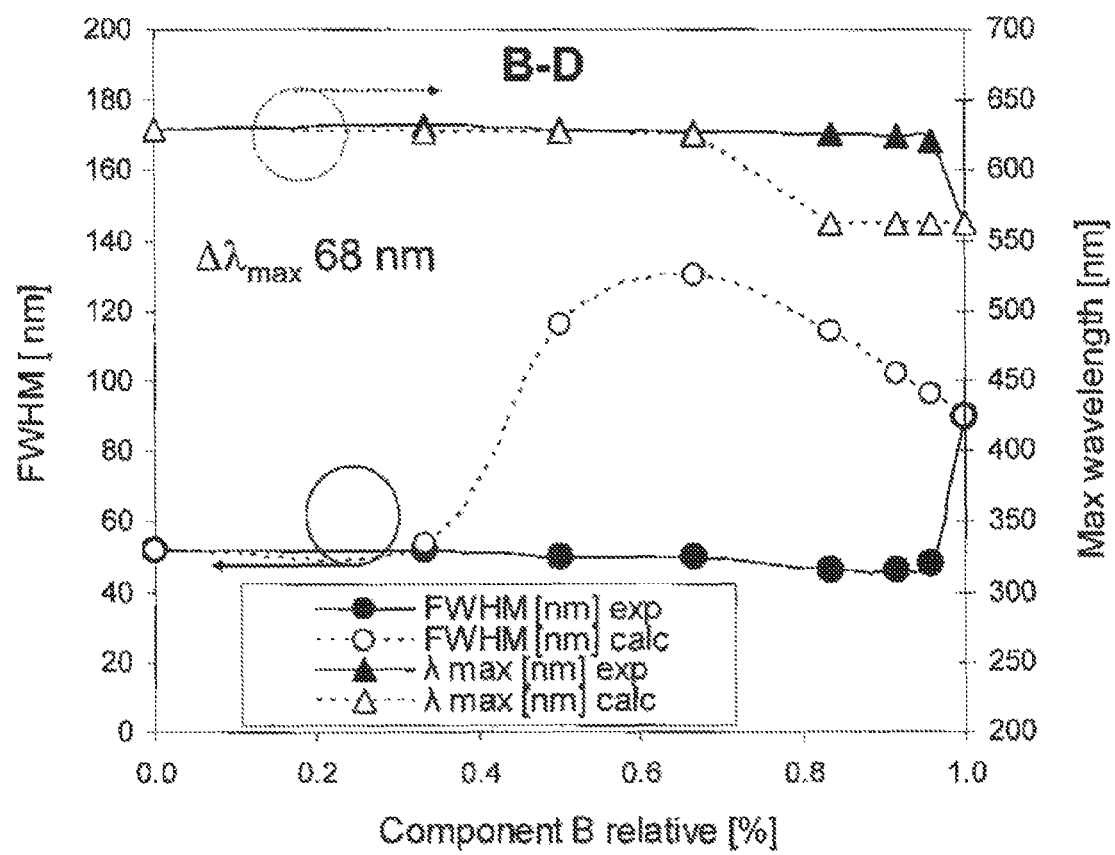
FIG. 18 shows maximum wavelength and FWHM values for the devices of Example 5 with variable [%] of emitters B and D. Both measured experimental data and results calculated by adding spectra proportional to emitter concentration are shown.

FIG. 18 shows maximum wavelength and FWHM values for the devices of Example 5 with variable [%] of emitters B and D. Both measured experimental data and results calculated by adding spectra proportional to emitter concentration are shown.

Figure 19:
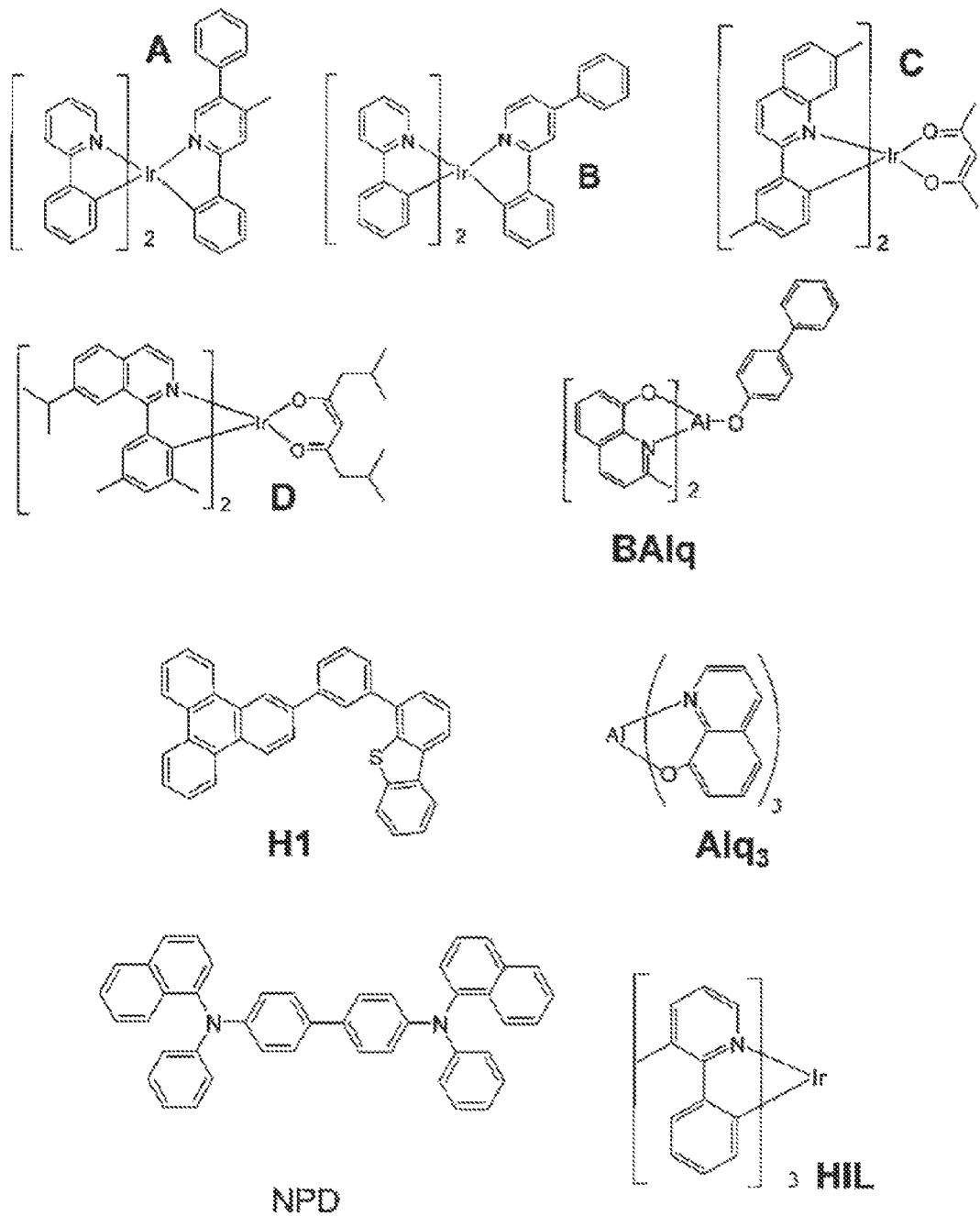
FIG. 19 shows chemical structures for compounds used in device fabrication.

FIG. 19 shows chemical structures for compounds used in device fabrication

Table 7 shows EL, JVL, and LT performance of the devices of Example 5 with variable [%] of emitters B and D.

TABLE 7

EL, JVL, LT performance of the devices Example 5 with variable [%] of emitters B and D

| Example 5 | | | | | | At 1,000 nits | | | | At 10,000 nits | At 40 mA/cm$^2$ | |
|---|---|---|---|---|---|---|---|---|---|---|---|---|
| BD | | 1931 CIE | | $\lambda_{max}$ | FWHM | Voltage | LE | EQE | PE | LT$_{97\%}$ | L$_0$ | LT$_{97\%}$ |
| B % | D % | x | y | [nm] | [nm] | [V] | [cd/A] | [%] | [lm/W] | [h]* | [nits] | [h] |
| 0 | 10 | 0.688 | 0.308 | 630 | 52 | 9.6 | 10.9 | 15.3 | 3.5 | 1 | 3372 | 8 |
| 4 | 8 | 0.69 | 0.31 | 632 | 52 | 7.6 | 12.6 | 18.3 | 5.2 | 6 | 4,172 | 29 |
| 6 | 6 | 0.687 | 0.31 | 630 | 50 | 7.6 | 14 | 19.8 | 5.7 | 9 | 4,770 | 36 |
| 8 | 4 | 0.677 | 0.32 | 628 | 50 | 7.5 | 14.9 | 19.2 | 6.2 | 32 | 5,265 | 100 |
| 10 | 2 | 0.646 | 0.35 | 626 | 46 | 7.1 | 19.5 | 20 | 8.6 | 46 | 6,888 | 90 |
| 11 | 1 | 0.6 | 0.39 | 624 | 46 | 6.8 | 24.7 | 19 | 11.3 | 79 | 8,524 | 105 |
| 11.5 | 0.5 | 0.541 | 0.45 | 622 | 48 | 6.4 | 32.1 | 17.5 | 15.8 | 64 | 10,888 | 55 |
| 12 | 0 | 0.457 | 0.53 | 562 | 90 | 5.9 | 47.3 | 14.8 | 25.2 | 63 | 15,789 | 28 |

*Calculated assuming acceleration factor 1.8

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting

The invention claimed is:

1. A method of fabricating a first device, comprising:
   providing a first container that contains, in a desired proportion:
   a first organic emitting material having a first peak wavelength;
   a second organic emitting material having a second peak wavelength
   providing a substrate having a first electrode disposed thereon;
   depositing an emissive layer over the first electrode, wherein the first container is a source of material for depositing, and wherein the emissive layer has a homogeneous composition and comprises the first and second organic emitting materials in the desired proportion;
   depositing a second electrode over the first emissive layer, and
   wherein the second peak wavelength is between 0 and 40 nm greater than the first peak wavelength.

2. The method of claim 1, wherein depositing the emissive layer further comprises depositing an organic host material along with the first and second organic emitting materials.

3. The method of claim 2, wherein the organic host material is provided in the first container along with the first and second organic emitting materials, and the organic host material is deposited from the first container along with the first and second organic emitting materials.

4. The method of claim 2, wherein the organic host material is provided in a second container and the organic host material is deposited from the second container.

5. The method of claim 1, wherein the first and second organic emitting materials are phosphorescent organic light emitting materials.

6. The method of claim 1, wherein the second peak wavelength is between 12 and 28 nm greater than the first peak wavelength.

7. The method of claim 1, wherein the FWHM of the emissive spectrum of the first device is less than the greater of the FWHM of the emissive spectrum of: (i) a second device that is the same as the first device in all respects except that it includes the first emitting material but not the second emitting material, and (ii) a third device that is the same as the first device in all respects except that it includes the second emitting material but not the first emitting material.

8. The method of claim 1, wherein the first device emits a third peak wavelength that is between the first peak wavelength and the second peak wavelength.

9. The method of claim 1, wherein the first electrode, the emissive layer, and the second electrode forming a first device wherein, the first device emits a third peak wavelength that is between the first peak wavelength and the second peak wavelength;

the concentration of the first organic emitting material in the emissive layer is C1, the concentration of the second organic emitting material in the emissive layer is C2, the first, second and third peak wavelengths are $\lambda 1$, $\lambda 2$, and $\lambda 3$, respectively, and the third peak wavelength $\lambda 3$ is within 4% of:

$$((\lambda 1\ C1)+(\lambda 2\ C2))/(C1+C2).$$

10. The method of claim 9, wherein the measured FWHM of the emissive spectrum of the first device is less than the combined emission of the first and second emitting materials calculated based on the proportions of the first and second emitting materials present in the emissive layer.

11. The method of claim 9, wherein the measured FWHM of the emissive spectrum of the first device is at least 10% less than the combined emission of the first and second emitting materials calculated based on the proportions of the first and second emitting materials present in the emissive layer.

12. The method of claim 9, wherein the first device is an organic light emitting device.

13. The method of claim 9, wherein the first device is a panel comprising a plurality of organic light emitting devices controlled by an active matrix.

14. The method of claim 9, wherein the first device is a consumer product.

* * * * *